(12) United States Patent
Kim et al.

(10) Patent No.: US 10,732,343 B2
(45) Date of Patent: Aug. 4, 2020

(54) OPTICAL MEMBER AND DISPLAY DEVICE INCLUDING THE SAME

(71) Applicant: Samsung Display Co., Ltd., Yongin-si (KR)

(72) Inventors: Do Hun Kim, Suwon-si (KR); Ji Eun Nam, Seoul (KR); Young Min Park, Hwaseong-si (KR); You Jin Seo, Hwaseong-si (KR); Hyeon Mi Lee, Tongyeong-si (KR); Hyeon Seon Jeong, Ansan-si (KR); Taek Sun Shin, Yongin-si (KR); Seong Yong Hwang, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/373,999

(22) Filed: Apr. 3, 2019

(65) Prior Publication Data

US 2019/0391314 A1 Dec. 26, 2019

(30) Foreign Application Priority Data

Jun. 26, 2018 (KR) .......................... 10-2018-0073476

(51) Int. Cl.
*G02B 6/00* (2006.01)
*F21V 8/00* (2006.01)
*H01L 33/50* (2010.01)

(52) U.S. Cl.
CPC .......... *G02B 6/005* (2013.01); *G02B 6/0055* (2013.01); *H01L 33/50* (2013.01)

(58) Field of Classification Search
CPC .............................. G02B 6/005; G02B 6/0055
USPC ........................................................ 362/606
See application file for complete search history.

(56) References Cited

U.S. PATENT DOCUMENTS

2013/0258247 A1* 10/2013 Tang .................... G02B 6/0023
349/65
2017/0205664 A1* 7/2017 Cho .................. G02F 1/133606
2018/0052275 A1 2/2018 Lee et al.
2019/0377119 A1* 12/2019 Jang ........................ G02B 6/003

FOREIGN PATENT DOCUMENTS

| GB | 2547589 | | 8/2017 |
| JP | 2004031146 A | * | 1/2004 |
| KR | 10-2017-0074947 | | 6/2017 |
| KR | 10-2018-0021514 | | 3/2018 |

* cited by examiner

*Primary Examiner* — Christopher M Raabe
(74) *Attorney, Agent, or Firm* — H.C. Park & Associates, PLC

(57) ABSTRACT

An optical member includes a light guide plate, a wavelength conversion layer, and a reflective tape. The wavelength conversion layer is disposed on an upper surface of the light guide plate. The reflective tape includes a first side portion covering first side surfaces of the light guide plate and the wavelength conversion layer. The reflective tape includes a first surface and a second surface. The first surface is configured to reflect light of a first wavelength band and light of a second wavelength band different from the first wavelength band. The second surface is configured to absorb the light of the first wavelength band.

37 Claims, 20 Drawing Sheets

OPTICAL MEMBER AND DISPLAY DEVICE INCLUDING THE SAME

CROSS-REFERENCE TO RELATED APPLICATION

This application claims priority from and the benefit of Korean Patent Application No. 10-2018-0073476, filed Jun. 26, 2018, which is hereby incorporated by reference for all purposes as if fully set forth herein.

BACKGROUND

Field

Exemplary embodiments generally relate to display technology, and more particularly, to an optical member and a display device including the same.

Discussion

A liquid crystal display typically receives light from a backlight assembly and displays an image. Some backlight assemblies include a light source and a light guide plate. The light guide plate receives light from the light source and guides the light toward a display panel. In some products, the light source provides white light, and the white light may be filtered by a color filter of the display panel to realize color.

Interest has been directed to the application of a wavelength conversion film to improve image quality, such as color reproducibility, of a liquid crystal display. Generally, a blue light source may be used as a light source, and a wavelength conversion film may be disposed on a light guide plate to convert blue light into white light. When light emitted from the blue light source leaks through a side surface of the light guide plate, it may be recognized as light leakage by a user (or observer). In addition, the wavelength conversion film may include wavelength conversion particles. The wavelength conversion particles are typically vulnerable to moisture and are easily oxidized, and, therefore, should be protected.

The above information disclosed in this section is only for understanding the background of the inventive concepts, and, therefore, may contain information that does not form prior art.

SUMMARY

Some exemplary embodiments provide an optical member capable of preventing leakage of incident light and preventing oxidation of a wavelength conversion layer.

Some exemplary embodiments provide a display device including an optical member capable of preventing leakage of incident light and preventing oxidation of a wavelength conversion layer.

Additional aspects will be set forth in the detailed description which follows, and, in part, will be apparent from the disclosure, or may be learned by practice of the inventive concepts.

According to some exemplary embodiments, an optical member includes a light guide plate, a wavelength conversion layer, and a reflective tape. The wavelength conversion layer is disposed on an upper surface of the light guide plate. The reflective tape includes a first side portion covering first side surfaces of the light guide plate and the wavelength conversion layer. The reflective tape includes a first surface and a second surface. The first surface is configured to reflect light of a first wavelength band and light of a second wavelength band different from the first wavelength band. The second surface is configured to absorb the light of the first wavelength band.

According to some exemplary embodiments, an optical member includes a light guide plate, a wavelength conversion layer, and a reflective tape. The wavelength conversion layer is disposed on an upper surface of the light guide plate. The reflective tape includes a plurality of side portions covering at least two side surfaces from among a plurality of side surfaces of each of the light guide plate and the wavelength conversion layer. The reflective tape includes a first surface and a second surface. The first surface is configured to reflect light of a first wavelength band and light of a second wavelength band different from the first wavelength band. The second surface is configured to absorb the light of the first wavelength band.

According to some exemplary embodiments, a display device includes an optical member, a light source, and a display panel. The optical member includes a light guide plate, a wavelength conversion layer, and a reflective tape. The wavelength conversion layer is disposed on an upper surface of the light guide plate. The reflective tape includes a first side portion covering first side surfaces of the light guide plate and the wavelength conversion layer. The light source is disposed on at least one side of the light guide plate. The display panel is disposed above the optical member. The reflective tape includes a first surface and a second surface. The first surface is configured to reflect light of a first wavelength band and light of a second wavelength band different from the first wavelength band. The second surface is configured to absorb the light of the first wavelength band.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
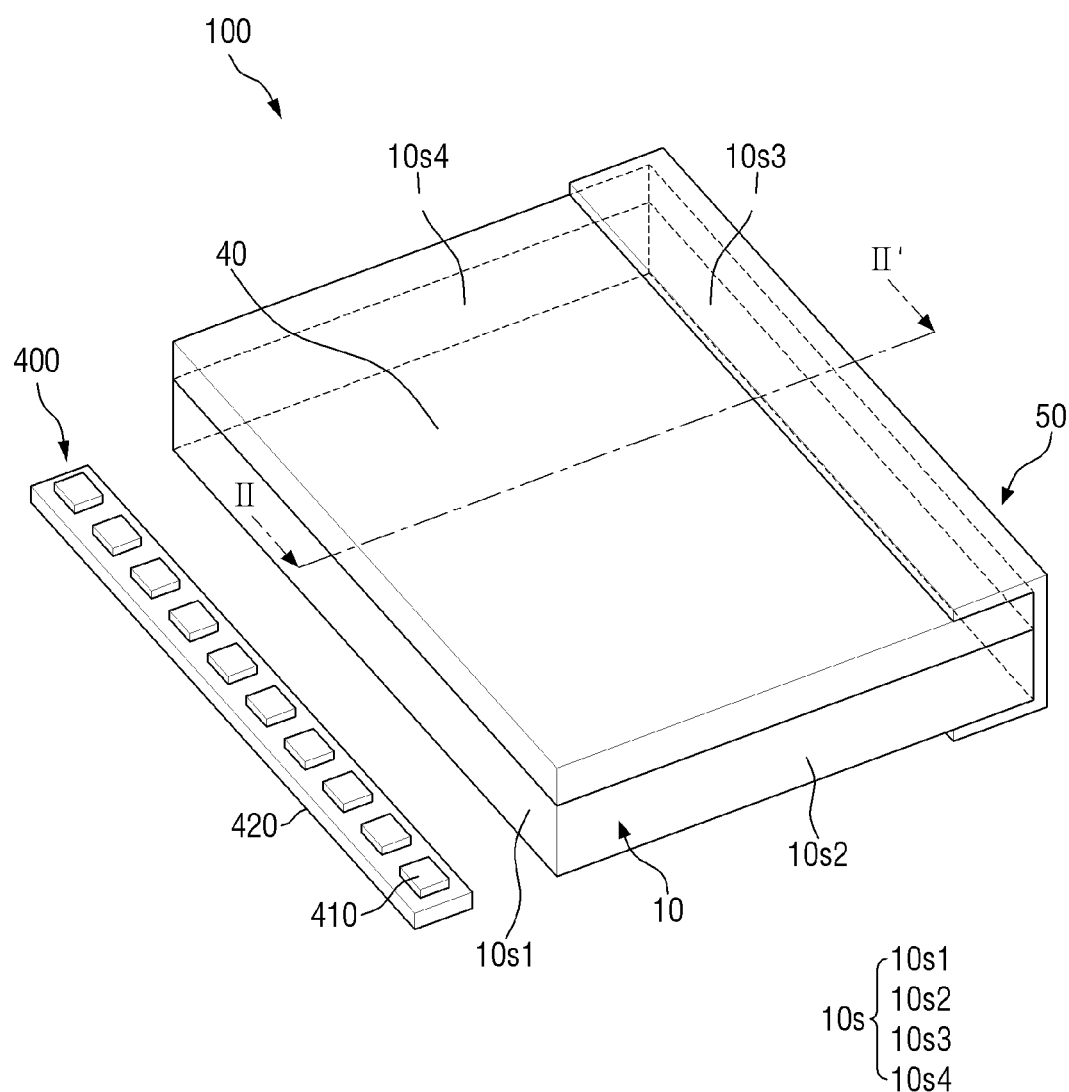
FIG. 1 is a perspective view of an optical member and a light source according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or to intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to cross-sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 2:
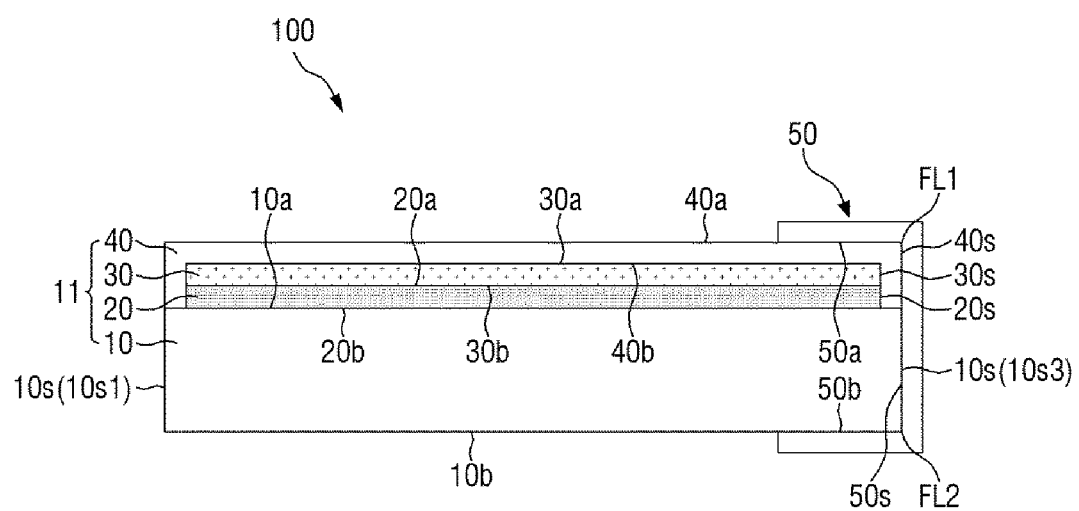
FIG. 2 is a cross-sectional view taken along sectional line II-II' of FIG. 1 according to some exemplary embodiments.

FIG. 1 is a perspective view of an optical member 100 and a light source 400 according to some exemplary embodiments. FIG. 2 is a cross-sectional view taken along sectional line II-II' of FIG. 1 according to some exemplary embodiments.

Referring to FIGS. 1 and 2, the optical member 100 includes a light guide plate 10, a low refractive layer 20 disposed on the light guide plate 10, a wavelength conversion layer 30 disposed on the low refractive layer 20, a passivation layer 40 disposed on the wavelength conversion layer 30, and a reflective tape 50. The light guide plate 10, the low refractive layer 20, the wavelength conversion layer 30, and the passivation layer 40 may be integrally combined to form a laminated structure 11. The reflective tape 50 may cover one side surface of the laminated structure 11. In this case, an upper surface of the laminated structure 11 may be an upper surface 40a of the passivation layer 40, and a lower surface of the laminated structure 11 may be a lower surface 10b of the light guide plate 10.

The light guide plate 10 serves to guide the path of light. The light guide plate 10 may generally be shaped like a polygonal column. The planar shape of the light guide plate 10 may be, but is not limited to, a rectangular shape. In some exemplary embodiments, the light guide plate 10 may be shaped like a hexagonal column having a rectangular planar shape and may include an upper surface 10a, the lower surface 10b, and four side surfaces 10s (10s1, 10s2, 10s3 and 10s4). In a case where it is necessary to distinguish the four side surfaces from each other in this written description and the accompanying drawings, the four side surfaces will be indicated by "10s1," "10s2," "10s3," and "10s4." However, when a side surface is simply mentioned, it will be indicated by "10s."

In some exemplary embodiments, each of the upper surface 10a and the lower surface 10b of the light guide plate 10 may be located in one plane, and the plane in which the upper surface 10a is located and the plane in which the lower surface 10b is located may be substantially parallel such that the overall thickness of the light guide plate 10 is uniform. However, the upper surface 10a or the lower surface 10b can be composed of a plurality of planes, or the plane in which the upper surface 10a is located and the plane in which the lower surface 10b is located can intersect each other. For example, the light guide plate 10, like a wedge-type light guide plate, may become thinner from a side surface (e.g., a light incidence surface, such as side surface 10s1) toward the other side surface (e.g., a counter surface, such as side surface 10s3) facing the aforementioned side surface, e.g., side surface 10s1. Alternatively, the lower surface 10b may, up to a specific point, slope upward from a side surface (e.g., the light incidence surface, e.g., side surface 10s1) toward the other side surface (e.g., the counter surface, such as the side surface 10s3) facing the aforementioned side surface, e.g., the side surface 10s1, such that the light guide plate 10 becomes thinner, and then the upper surface 10a and the lower surface 10b may be flat.

The plane in which the upper surface 10a and/or the lower surface 10b is located may be at an angle of about 90 degrees to a plane in which each side surface 10s is located. In some exemplary embodiments, the light guide plate 10 may further include an inclined surface between the upper surface 10a and a side surface 10s and/or between the lower surface 10b and the side surface 10s. The inclined surface will be described later in associated with FIG. 12, and a case where the upper surface 10a and the side surface 10s meet directly at an angle of 90 degrees without an inclined surface will be described below.

In some exemplary embodiments of the optical member 100, the light source 400 may be disposed adjacent to at least one side surface 10s of the light guide plate 10. As seen in at least FIGS. 1 and 2, a plurality of light-emitting diode (LED) light sources 410 mounted on a printed circuit board 420 are disposed adjacent to a side surface 10s1 at one long side of the light guide plate 10. However, exemplary embodiments are not limited to this case. For example, the LED light sources 410 may be disposed adjacent to side surfaces 10s1 and 10s3 at both long sides or may be disposed adjacent to a side surface 10s2 or 10s4 at one short side or the side surfaces 10s2 and 10s4 at both short sides. As seen in FIG. 1, the side surface 10s1 at one long side of the light guide plate 10 to which the light source 400 is disposed adjacent may be a light incidence surface (for ease of description, indicated by "10s1" in the drawings) on which light of the light source 400 is directly incident, and the side surface 10s3 at the other long side that faces the side surface 10s1 may be a counter surface (for ease of description, indicated by "10s3" in the drawings).

In some exemplary embodiments, the LED light sources 410 may emit blue light. That is, light emitted from the LED light sources 410 may be light having a blue wavelength band. In some exemplary embodiments, the wavelength band of blue light emitted from the LED light sources 410 may be 400 nm to 500 nm. The blue light emitted from the LED light sources 410 may enter the light guide plate 10 through the light incidence surface 10s1.

The light guide plate 10 may include an inorganic material. For example, the light guide plate 10 may be made of glass.

The low refractive layer 20 is disposed on the upper surface 10a of the light guide plate 10. The low refractive layer 20 may be formed directly on the upper surface 10a of the light guide plate 10 to contact the upper surface 10a of the light guide plate 10. The low refractive layer 20 is interposed between the light guide plate 10 and the wavelength conversion layer 30 to help total reflection of the light guide plate 10.

For instance, in order for the light guide plate 10 to efficiently guide light from the light incidence surface 10s1 toward the counter surface 10s3, effective total internal reflection should occur on the upper surface 10a and the lower surface 10b of the light guide plate 10. One of the conditions under which total internal reflection can occur in the light guide plate 10 is that a refractive index of the light guide plate 10 is greater than a refractive index of a medium that forms an optical interface with the light guide plate 10. As the refractive index of the medium that forms the optical interface with the light guide plate 10 is lower, a total reflection critical angle becomes smaller, leading to more total internal reflections.

For example, in a case where the light guide plate 10 is made of glass having a refractive index of about 1.5, sufficient total reflection can occur on the lower surface 10b of the light guide plate 10 because the lower surface 10b is exposed to an air layer having a refractive index of about 1 and forms an optical interface with the air layer.

On the other hand, since other optical functional layers are integrally laminated on the upper surface 10a of the light guide plate 10, it is more difficult to achieve sufficient total reflection on the upper surface 10a compared with the lower surface 10b. For example, if a material layer having a refractive index of 1.5 or more is laminated on the upper surface 10a of the light guide plate 10, total reflection cannot occur on the upper surface 10a of the light guide plate 10. In addition, if a material layer having a refractive index of, e.g., about 1.49 slightly smaller than that of the light guide plate 10 is laminated on the upper surface 10a of the light guide plate 10, total internal reflection can occur on the upper surface 10a of the light guide plate 10, but sufficient total reflection cannot occur due to a too large critical angle. The wavelength conversion layer 30 laminated on the upper surface 10a of the light guide plate 10 typically has a refractive index of about 1.5. If this wavelength conversion layer 30 is directly laminated on the upper surface 10a of the light guide plate 10, it is difficult to have sufficient total reflection on the upper surface 10a of the light guide plate 10.

The low refractive layer 20 interposed between the light guide plate 10 and the wavelength conversion layer 30 to form an interface with the upper surface 10a of the light guide plate 10 has a refractive index lower than that of the light guide plate 10 so that total reflection can occur on the upper surface 10a of the light guide plate 10. In addition, the low refractive layer 20 has a refractive index lower than that of the wavelength conversion layer 30, which is a material layer disposed on the low refractive layer 20, so that more total reflection can occur than when the wavelength conversion layer 30 is disposed directly on the upper surface 10a of the light guide plate 10.

The difference between the refractive index of the light guide plate 10 and the refractive index of the low refractive layer 20 may be 0.2 or more. When the refractive index of the low refractive layer 20 is smaller than the refractive index of the light guide plate 10 by 0.2 or more, sufficient total reflection may occur on the upper surface 10a of the light guide plate 10. There is no upper limit on the difference between the refractive index of the light guide plate 10 and the refractive index of the low refractive layer 20. However, considering the typical material of the light guide plate 10 and the typical refractive index of the low refractive layer 20, the difference between the refractive index of the light guide plate 10 and the refractive index of the low refractive layer 20 may be 1 or less.

The refractive index of the low refractive layer 20 may be in the range of 1.2 to 1.4. Generally, as the refractive index of a solid medium becomes closer to 1, the manufacturing cost increases exponentially. When the refractive index of the low refractive layer 20 is 1.2 or more, an excessive increase in the manufacturing cost can be prevented. In addition, the low refractive layer 20 having a refractive index of 1.4 or less is advantageous in sufficiently reducing the total reflection critical angle of the upper surface 10a of the light guide plate 10. In some exemplary embodiments, the low refractive layer 20 having a refractive index of about 1.25 may be applied.

Figure 3:
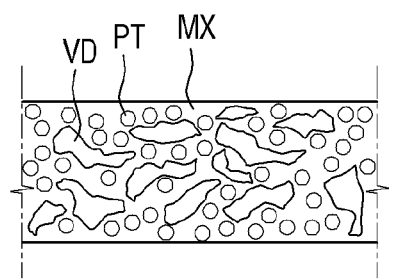
FIGS. 3 and 4 are cross-sectional views of low refractive layers according to various exemplary embodiments.
Figure 4:
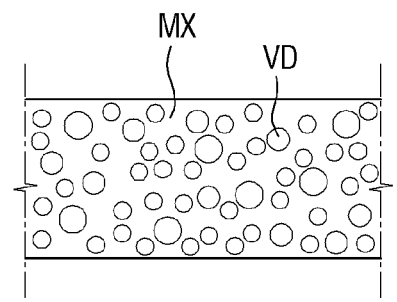

To have the above-mentioned low refractive index, the low refractive layer 20 may include voids. The voids may be made of vacuum (or in a vacuum state) or may be filled with an air layer, gas, or the like. The spaces of the voids may be defined by particles or a matrix. FIGS. 3 and 4 will be referred to for a more detailed description.

FIGS. 3 and 4 are cross-sectional views of low refractive layers according to various exemplary embodiments.

In some exemplary embodiments, a low refractive layer 20 may include a plurality of particles PT, a matrix MX surrounding the particles PT and formed as a single piece, and a plurality of voids VD, as illustrated in FIG. 3. The particles PT may be a filler that adjusts the refractive index and mechanical strength of the low refractive layer 20.

The particles PT may be dispersed within the matrix MX of the low refractive layer 20, and the voids VD may be formed in open portions of the matrix MX. For example, after the particles PT and the matrix MX are mixed in a solvent, if the mixture is dried and/or cured, the solvent may evaporate. At this time, the voids VD may be formed between portions of the matrix MX.

In some exemplary embodiments, a low refractive layer 20 may include a matrix MX and voids VD without particles, as illustrated in FIG. 4. For example, the low refractive layer 20 may include the matrix MX formed as a single piece like foam resin and a plurality of voids VD disposed in the matrix MX.

When the refractive layer 20 includes the voids VD as illustrated in FIGS. 3 and 4, a total refractive index of the low refractive layer 20 may have a value between a refractive index of the particles PT/the matrix MX and a refractive index of the voids VD. When the voids VD are filled with vacuum having a refractive index of 1 or an air layer or gas having a refractive index of about 1, even if a material having a refractive index of 1.4 or more is used as the particles PT/the matrix MX, the total (or effective) refractive index of the low refractive layer 20 may have a value of 1.4 or less, for example, about 1.25. In some exemplary embodiments, the particles PT may be made of an inorganic material, such as $SiO_2$, $Fe_2O_3$, or $MgF_2$, and the matrix MX may be made of an organic material, such as polysiloxane. However, other organic materials and/or inorganic materials can be used.

Referring again to FIGS. 1 and 2, the low refractive layer 20 may have a thickness of 0.4 μm to 2 μm, e.g., 0.4 μm to 1 μm, for instance, 1 μm to 2 μm, e.g., 0.7 μm to 1.1 μm, such as 0.6 μm to 1.5 μm. When the thickness of the low refractive layer 20 is 0.4 μm or more, which is a visible light wavelength range, the low refractive layer 20 may form an effective optical interface with the upper surface 10a of the light guide plate 10. Therefore, total reflection according to Snell's law may occur well on the upper surface 10a of the light guide plate 10. A too thick low refractive layer 20 may go against the thinning of the optical member 100, increase the material cost, and undermine the luminance of the optical member 100. Therefore, the low refractive layer 20 may be formed to a thickness of 2 upm or less.

In some exemplary embodiments, the low refractive layer 20 may cover most of the upper surface 10a of the light guide plate 10, but may expose part of edges of the light guide plate 10. In other words, the side surfaces 10s of the light guide plate 10 may protrude from side surfaces 20s of the low refractive layer 20. A portion of the upper surface 10a that is exposed by the low refractive layer 20 may provide a space where the side surfaces 20s of the low refractive layer 20 can be stably covered by the passivation layer 40.

In some exemplary embodiments, the low refractive layer 20 may cover the entire upper surface 10a of the light guide plate 10. The side surfaces 20s of the low refractive layer 20 may be aligned with the side surfaces 10s of the light guide plate 10, respectively. The difference between these embodiments may result from the manufacturing process of the light guide plate 10. This will be described in more detail later with reference to FIGS. 5 through 8.

The low refractive layer 20 may be formed by any suitable method, such as coating. For example, the low refractive layer 20 may be formed by coating a composition for forming a low refractive layer 20 on the upper surface 10a of the light guide plate 10 and drying and curing the composition. Examples of the method of coating the composition for forming a low refractive layer 20 include slit coating, spin coating, roll coating, spray coating, and ink jet printing. However, the coating method is not limited to the aforementioned examples, and various other methods. e.g., lamination, coating, deposition, etc., methods can be applied.

Although not illustrated, a barrier layer may be further disposed between the low refractive layer 20 and the light guide plate 10. The barrier layer may cover the entire upper surface 10a of the light guide plate 10. Side surfaces of the barrier layer may be aligned with the side surfaces 10s of the light guide plate 10. The low refractive layer 20 may be formed to contact an upper surface of the barrier layer. The low refractive layer 20 may expose part of edges of the barrier layer.

Like the passivation layer 40 to be described later, the barrier layer serves to prevent the penetration of moisture and/or oxygen (hereinafter, referred to as "moisture/oxygen"). The barrier layer may include an inorganic material. For example, the barrier layer may be made of at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and a metal thin film having secured (or sufficient) light transmittance. The barrier layer may be made of, but is not limited to, the same material as the passivation layer 40. The barrier layer may be formed by a deposition method, such as chemical vapor deposition.

The wavelength conversion layer 30 may be disposed on an upper surface 20a of the low refractive layer 20. The wavelength conversion layer 30 converts the wavelength of at least a portion of incident light. The wavelength conversion layer 30 may include a binder layer and wavelength conversion particles dispersed in the binder layer. The wavelength conversion layer 30 may further include scattering particles dispersed in the binder layer in addition to the wavelength conversion particles.

The binder layer is a medium in which the wavelength conversion particles are dispersed and may be made of various resin compositions that can be generally referred to as binders. However, exemplary embodiments are not limited to this case, and any medium in which the wavelength conversion particles and/or the scattering particles can be dispersed can be referred to as the binder layer regardless of its name, additional other functions, constituent material, and/or the like.

The wavelength conversion particles are particles that convert the wavelength of incident light. For example, the wavelength conversion particles may be at least one of quantum dots, a fluorescent material, and a phosphorescent material. For instance, the quantum dots, which are an example of the wavelength conversion particles, are a material having a crystal structure of several nanometers in size. The quantum dots may be composed of several hundreds to thousands of atoms and exhibit a quantum confinement effect in which an energy band gap increases due to the small size of the quantum dots. When light of a wavelength having a higher energy than a band gap is incident on the quantum dots, the quantum dots are excited by absorbing the light and fall to a ground state while emitting light of a specific wavelength (or range of wavelengths). The emitted light of the specific wavelength has a value corresponding to the band gap. Emission characteristics of the quantum dots due to the quantum confinement effect can be adjusted by controlling the size and composition of the quantum dots.

The quantum dots include at least one of a group II-VI compound, a group II-V compound, a group III-VI compound, a group III-V compound, a group IV-VI compound, a group I-III-VI compound, a group II-IV-VI compound, and a group II-IV-V compound.

A quantum dot may include a core and a shell overcoating the core. The core may be, but is not limited to, at least one of, for example, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge. The shell may include, but is not limited to, at least one of, for example, ZnS, ZnSe, ZnTe, CdS, CdSc, CdTc, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

The wavelength conversion particles may include a plurality of wavelength conversion particles that convert incident light into different wavelengths. For example, the wavelength conversion particles may include first wavelength conversion particles that convert incident light of a specific wavelength into light of a first wavelength and emit the light of the first wavelength, and second wavelength conversion particles that convert the incident light of the specific wavelength into light of a second wavelength and emit the light of the second wavelength. In some exemplary embodiments, light emitted from the light source 400 and then incident on the wavelength conversion particles may be light of a blue wavelength, the first wavelength may be a green wavelength, and the second wavelength may be a red wavelength. For example, the blue wavelength may be a wavelength having a peak at 420 nm to 470 nm, the green wavelength may be a wavelength having a peak at 520 nm to 570 nm, and the red wavelength may be a wavelength having a peak at 620 nm to 670 nm. However, the blue, green, and red wavelengths are not limited to the aforementioned example and include all wavelength ranges that can be recognized in the art as blue, green, and red.

In the above exemplary embodiment(s), when blue light incident on the wavelength conversion layer 30 passes through the wavelength conversion layer 30, a portion of the blue light may be incident on the first wavelength conversion particles to be converted into the green wavelength and emitted as light of the green wavelength, another portion of the blue light may be incident on the second wavelength conversion particles to be converted into the red wavelength and emitted as light of the red wavelength, and the remaining portion of the blue light may be emitted as it is without entering (or being incident with) the first and second wavelength conversion particles. Therefore, light that has passed through the wavelength conversion layer 30 may include all of the light of the blue wavelength, the light of the green wavelength, and the light of the red wavelength. If the ratio of the emitted light of the different wavelengths is appropriately adjusted, white light or outgoing light of other colors can be displayed. The light converted by the wavelength conversion layer 30 may be concentrated in a narrow range of specific wavelengths and may have a sharp spectrum with a narrow half width. Therefore, when the light of such a spectrum is filtered using a color filter to realize color, color reproducibility can be improved.

Unlike as previously described, incident light may be light having a short wavelength, such as ultraviolet light, and three types of wavelength conversion particles for converting the incident light into the blue, green, and red wavelengths may be disposed in the wavelength conversion layer 30 to emit white light.

The wavelength conversion layer 30 may further include scattering particles. The scattering particles may be non-quantum dot particles and have no wavelength conversion function. The scattering particles may scatter incident light to cause more incident light to enter the wavelength conversion particles. In addition, the scattering particles may uniformly control an output angle of light for each wavelength. For instance, when a portion of incident light that enters the wavelength conversion particles is emitted after its wavelength is converted by the wavelength conversion particles, the emission direction of the portion of the incident light may have random scattering characteristics. If there are no scattering particles in the wavelength conversion layer 30, the green and red wavelengths emitted after colliding with the wavelength conversion particles may have scattering emission characteristics, but the blue wavelength emitted without colliding with the wavelength conversion particles may not have the scattering emission characteristics. Therefore, the emission amount of the blue/green/red wavelength will vary according to the output angle. The scattering particles may give the scattering emission characteristics even to the blue wavelength emitted without colliding with the wavelength conversion particles, thereby controlling the output angle of light for each wavelength to be similar. The scattering particles may be made of, for instance, $TiO_2$ or $SiO_2$, but exemplary embodiments are not limited thereto.

The wavelength conversion layer 30 may be thicker than the low refractive layer 20. The thickness of the wavelength conversion layer 30 may be about 10 μm to 50 μm, such as 10 μm to 20 μm, for instance, 20 μm to 40 μm, e.g., 40 μm to 50 μm. In some exemplary embodiments, the thickness of the wavelength conversion layer 30 may be about 15 μm.

The wavelength conversion layer 30 may cover the upper surface 20a of the low refractive layer 20 and completely overlap the low refractive layer 20. A lower surface 30b of the wavelength conversion layer 30 may directly contact the upper surface 20a of the low refractive layer 20. In some exemplary embodiments, side surfaces 30s of the wavelength conversion layer 30 may be aligned with the side surfaces 20s of the low refractive layer 20.

As seen in FIG. 2, the side surfaces 30s of the wavelength conversion layer 30 and the side surfaces 20s of the low refractive layer 20 are aligned perpendicular to the upper surface 10a of the light guide plate 10. However, the side surfaces 30s of the wavelength conversion layer 30 and the side surfaces 20s of the low refractive layer 20 may not be perpendicular to the upper surface 10a of the light guide plate 10, but may have an inclination angle smaller than 90 degrees. An inclination angle of each side surface 30s of the wavelength conversion layer 30 may be smaller than an inclination angle of each side surface 20s of the low refractive layer 20. When the wavelength conversion layer 30 is formed by a method, such as slit coating, as will be described later, the side surfaces 30s of the relatively thick wavelength conversion layer 30 may have a gentler inclination angle than the side surfaces 20s of the low refractive layer 20. However, exemplary embodiments are not limited to this case. Depending on the formation method, the inclination angle of each side surface 30s of the wavelength conversion layer 30 may be substantially equal to or smaller than the inclination angle of each side surface 20s of the low refractive layer 20.

The wavelength conversion layer 30 may be formed by a method, such as coating. For example, the wavelength conversion layer 30 may be formed by slit-coating a wavelength conversion composition on the light guide plate 10 having the low refractive layer 20 and drying and curing the wavelength conversion composition. However, the method of forming the wavelength conversion layer 30 is not limited to the aforementioned example, and various other methods, e.g., lamination, coating, deposition, etc., methods can be applied.

The passivation layer 40 is disposed on the low refractive layer 20 and the wavelength conversion layer 30. The passivation layer 40 serves to prevent the penetration of moisture/oxygen. The passivation layer 40 may include an inorganic material, such as at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and a metal thin film having secured light transmittance. In some exemplary embodiments, the passivation layer 40 may be made of silicon nitride.

The passivation layer 40 may completely cover the low refractive layer 20 and the wavelength conversion layer 30 on at least one side. In some exemplary embodiments, the passivation layer 40 may completely cover the low refractive layer 20 and the wavelength conversion layer 30 on all sides.

The passivation layer 40 completely overlaps the wavelength conversion layer 30, covers an upper surface 30a of the wavelength conversion layer 30, and extends further outward to cover the side surfaces 30s of the wavelength conversion layer 30 and the side surfaces 20s of the low refractive layer 20. Further, a lower surface 40b of the passivation layer 40 may contact the upper surface 30a and the side surfaces 30s of the wavelength conversion layer 30 and the side surfaces 20s of the low refractive layer 20. The passivation layer 40 may extend up to the upper surface 10a at the edges of the light guide plate 10 exposed by the low refractive layer 20, such that part of edge portions of the passivation layer 40 can directly contact the upper surface 10a of the light guide plate 10. In some exemplary embodiments, side surfaces 40s of the passivation layer 40 may be aligned with the side surfaces 10s of the light guide plate 10.

The thickness of the passivation layer 40 may be smaller than that of the wavelength conversion layer 30 and may be similar to or smaller than that of the low refractive layer 20. The thickness of the passivation layer 40 may be 0.1 µm to 2 µm, e.g., 0.1 µm to 0.5 µm, for example, 0.3 µm to 0.5 µm, for instance, 0.5 µm to 1 µm, such as 1 µm to 2 µm. If the thickness of the passivation layer 40 is 0.1 µm or more, the passivation layer 40 can have a significant moisture/oxygen penetration preventing function. If the thickness is 0.3 µm or more, the passivation layer 40 can have an effective moisture/oxygen penetration preventing function. The passivation layer 40 having a thickness of 2 µm or less is advantageous in terms of thinning and transmittance. In some exemplary embodiments, the thickness of the passivation layer 40 may be about 0.4 µm.

The wavelength conversion layer 30, particularly the wavelength conversion particles included in the wavelength conversion layer 30, may be vulnerable to moisture/oxygen. In the case of a wavelength conversion film, a barrier film may be laminated on upper and lower surfaces 30a and 30b of a wavelength conversion layer 30 to prevent the penetration of moisture/oxygen into the wavelength conversion layer 30. However, since the wavelength conversion layer 30 is directly disposed without a barrier film, a sealing structure for protecting the wavelength conversion layer 30 is utilized. The sealing structure may be realized by the passivation layer 40 and the light guide plate 10.

The paths through which moisture can penetrate into the wavelength conversion layer 30 are the upper surface 30a, the side surfaces 30s, and the lower surface 30b of the wavelength conversion layer 30. As described above, since the upper surface 30a and the side surfaces 30s of the wavelength conversion layer 30 are covered and protected by the passivation layer 40, the penetration of moisture/oxygen can be blocked or at least reduced (hereinafter, referred to as "blocked/reduced").

On the other hand, the lower surface 30b of the wavelength conversion layer 30 is in contact with the upper surface 20a of the low refractive layer 20. If the low refractive layer 20 includes the voids VD or is made of an organic material, the movement of moisture in the low refractive layer 20 is possible. Therefore, moisture/oxygen can be introduced into the lower surface 30b of the wavelength conversion layer 30 through the low refractive layer 20. However, since the low refractive layer 20 also has a sealing structure in some exemplary embodiments, the penetration of moisture/oxygen through the lower surface 30b of the wavelength conversion layer 30 can be blocked/reduced at source.

For instance, since the side surfaces 20s of the low refractive layer 20 are covered and protected by the passivation layer 40, the penetration of moisture/oxygen through the side surfaces 20s of the low refractive layer 20 can be blocked/reduced. Even if the low refractive layer 20 protrudes further than the wavelength conversion layer 30 such that a portion of the upper surface 20a is exposed, since the protruding portion is covered and protected by the passivation layer 40, the penetration of moisture/oxygen through the protruding portion can be blocked/reduced. A lower surface 20b of the low refractive layer 20 is in contact with the light guide plate 10. When the light guide plate 10 is made of an inorganic material, such as glass, it can block/reduce the penetration of moisture/oxygen, like the passivation layer 40. That is, since the surfaces of a laminate of the low refractive layer 20 and the wavelength conversion layer 30 are surrounded and sealed by the passivation layer 40 and the light guide plate 10, even if a moisture/oxygen movement path is formed inside the low refractive layer 20, the penetration of moisture/oxygen can be blocked/reduced by the aforementioned sealing structure. Therefore, deterioration of the wavelength conversion particles due to moisture/oxygen can be prevented or at least mitigated.

The passivation layer 40 may be formed by any suitable method, such as vapor deposition. For example, the passivation layer 40 may be formed on the light guide plate 10, on which the low refractive layer 20 and the wavelength conversion layer 30 are sequentially formed, by chemical vapor deposition. However, the method of forming the passivation layer 40 is not limited to the aforementioned example, and various other methods, e.g., lamination, coating, deposition, etc., methods can be applied.

As described above, the optical member 100, which may be an integrated single member, can simultaneously perform a light guide function and a wavelength conversion function. The integrated single member can also simplify the process of manufacturing and/or assembling a display device. In addition, the optical member 100 enables total reflection to be performed effectively on the upper surface 10a of the light guide plate 10 by having the low refractive layer 20 disposed on the upper surface 10a of the light guide plate 10 and prevents deterioration of the wavelength conversion layer 30 by having the low refractive layer 20 and the wavelength conversion layer 30 sealed with the passivation layer 40.

Figure 5:
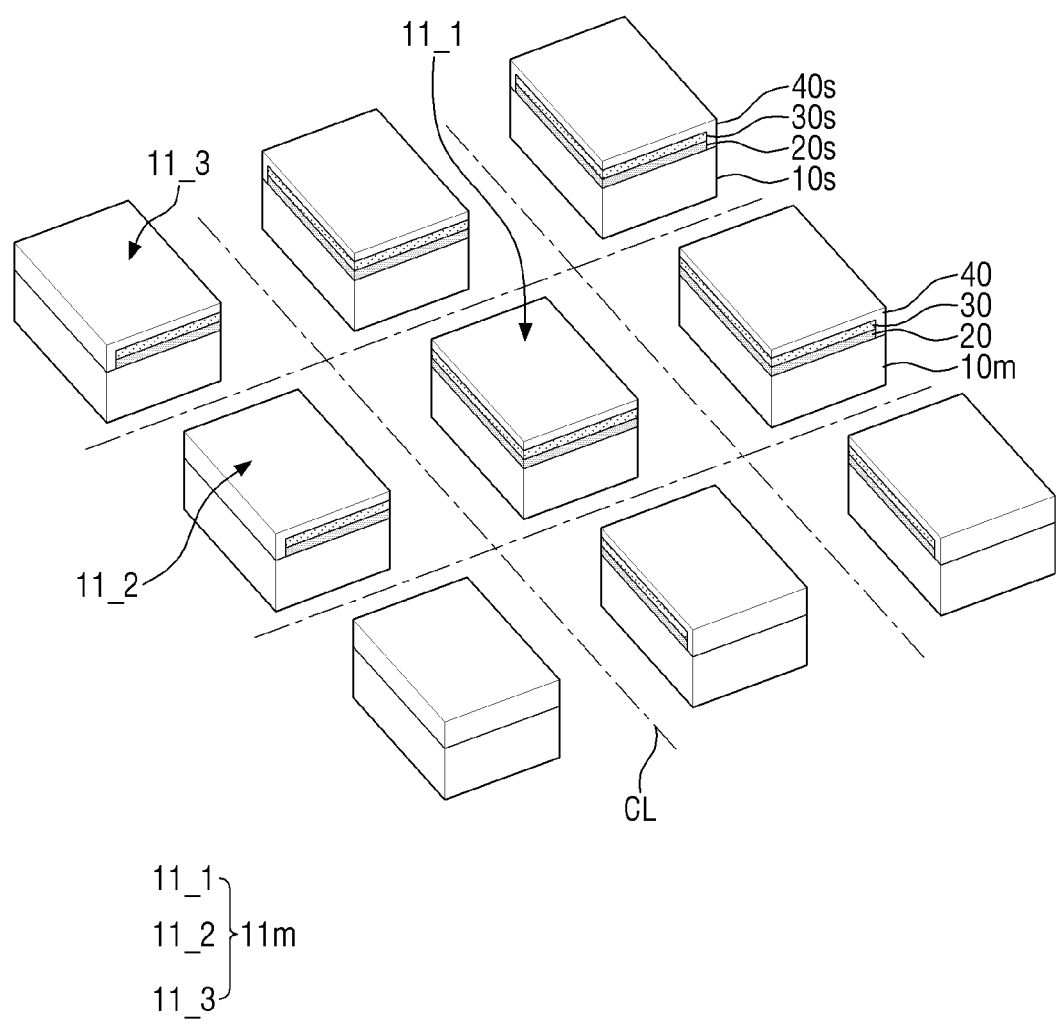
FIG. 5 is a perspective view of a mother optical member cut into nine equal parts according to some exemplary embodiments.
Figure 6:
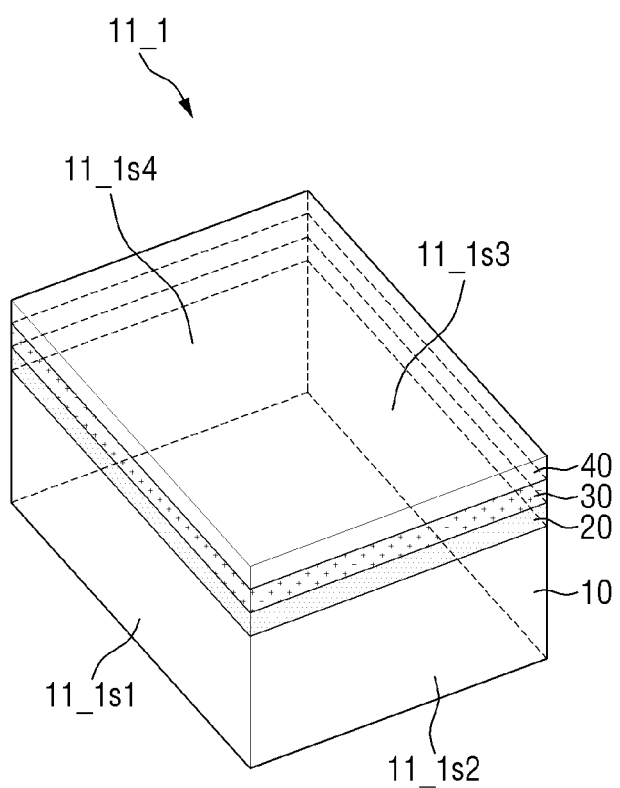
FIGS. 6 through 8 are perspective views of cut laminated structures according to various exemplary embodiments.
Figure 7:
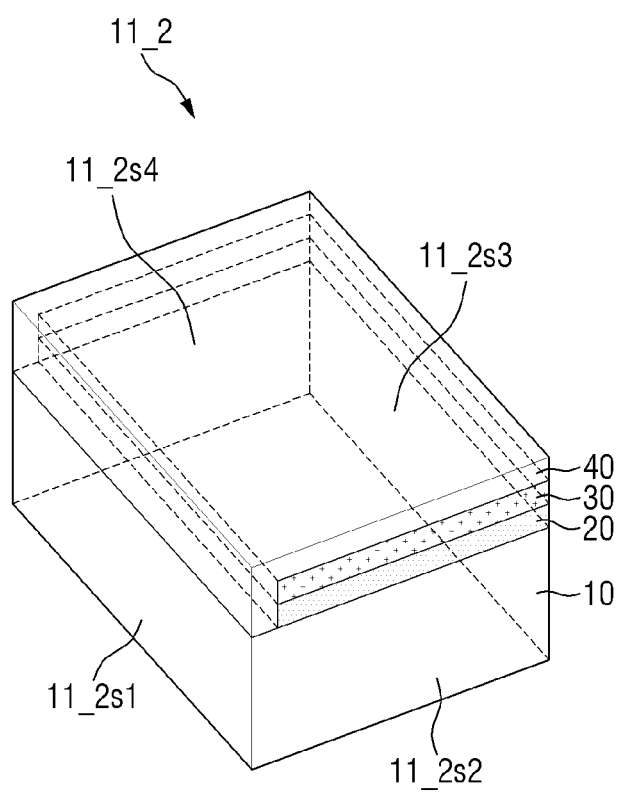
Figure 8:
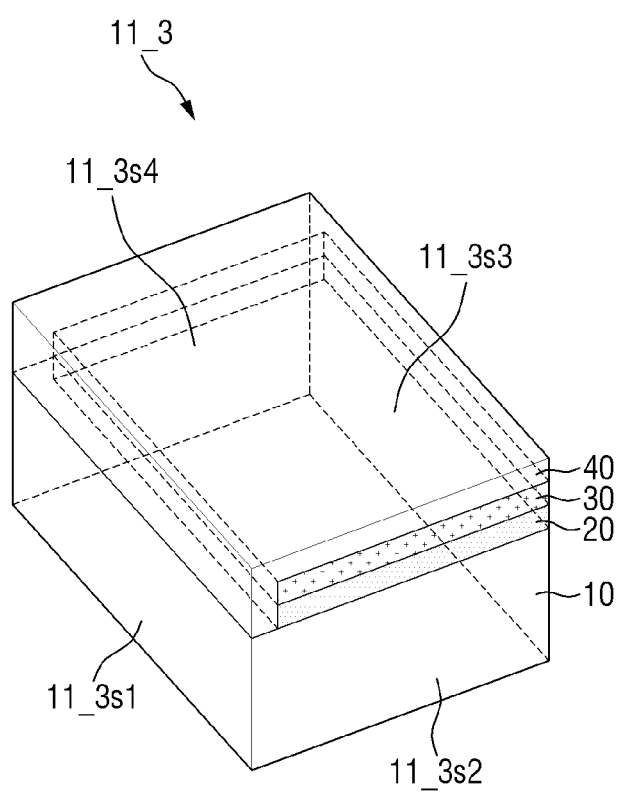

FIG. 5 is a perspective view of a mother optical member cut into nine equal parts according to some exemplary embodiments. FIGS. 6 through 8 are perspective views of cut laminated structures according to some exemplary embodiments.

Referring to FIG. 5, a mother laminated structure 11m may be formed by sequentially laminating a low refractive layer 20, a wavelength conversion layer 30, and a passivation layer 40 on a mother light guide plate 10m, which is shown cut into nine equal parts in FIG. 5. The mother laminated structure 11m may be obtained by forming the low refractive layer 20 and the wavelength conversion layer 30 to expose edges of an upper surface of the mother light guide plate 10m and then forming the passivation layer 40 to cover all side surfaces of the low refractive layer 20 and the wavelength conversion layer 30. If the mother laminated structure 11m in this state is applied as an optical member, it may have the same structure as the laminated structure 11 illustrated in FIG. 1.

In some exemplary embodiments, laminated structures may be obtained by forming the mother laminated structure 11m and then cutting the mother laminated structure 11m. That is, as illustrated in FIG. 5, a plurality of individual laminated structures 11_1, 11_2 and 11_3 may be obtained by cutting the prepared mother laminated structure 11m according to a predetermined size and/or number. In FIG. 5, the mother optical member 101 is cut into nine equal parts along cutting lines CL. A cut surface may have a different shape from an uncut surface. The individual laminated structures 11_1, 11_2 and 11_3 may have different side shapes according to the positions and the number of side surfaces that form cut surfaces.

FIGS. 6 through 8 illustrate three types of individual laminated structures from among nine individual laminated structures illustrated in FIG. 5 according to some exemplary embodiments. Referring to FIG. 6 illustrating one type, an individual laminated structure 11_1 has four cut side surfaces 11_1s1, 11_1s2, 11_11s3 and 11_1s4. That is, all the side surfaces 11_1s1, 11_1s2, 11_1s3 and 11_1s4 of the individual laminated structure 11_1 of FIG. 6 overlap (or correspond to) cut surfaces of the mother optical member (or mother laminated structure 11m). Thus, side surfaces 20s of the low refractive layer 20 and side surfaces 30s of the wavelength conversion layer 30 may be exposed to the outside without being covered with the passivation layer 40.

Referring to FIG. 7 illustrating another type, an individual laminated structure 11_2 has three cut side surfaces 11_2s2, 11_2s3 and 11_2s4 and one uncut side surface 11_2s1. Referring to FIG. 8 illustrating another type, an individual laminated structure 11_3 has two uncut side surfaces 11_3s1 and 11_3s4 and two cut side surfaces 11_3s2 and 11_3s3. Although not illustrated in the drawings, if the mother laminated structure 11m is cut into two individual laminated structures, the individual laminated structures may each have one cut side surface and three uncut side surfaces.

When the individual laminated structures 11_1, 11_2 and 11_3 have the cut side surfaces 11_1s1, 11_11s2, 11_11s3, 11_11s4, 11_2s2, 11_2s3, 11_2s4, 11_3s1, and 11_3s4, since the side surfaces 20s of the low refractive layer 20 and the side surfaces 30s of the wavelength conversion layer 30 are exposed at the cut side surfaces 11_1s1, 11_11s2, 11_11s3, 11_11s4, 11_2s2, 11_2s3, 11_2s4, 11_3s1, and 11_3s4 without being covered with the passivation layer 40, the penetration of moisture/oxygen through the side surfaces 20s and 30s may occur. In this case, the wavelength conversion layer 30 may deteriorate at the side surfaces 20s and 30s. As such, a moisture/oxygen barrier structure may be placed on the side surfaces 20s and 30s to prevent penetration of moisture/oxygen. As the moisture/oxygen barrier structure, a barrier film or a sealing tape may be applied. The moisture/oxygen barrier structure may be attached to a portion where sealing may be beneficial, for example, a cut side surface. In some exemplary embodiments, a reflective tape to be described later may be applied as the moisture/oxygen barrier structure.

Adverting back to FIGS. 1 and 2, the reflective tape 50 may be disposed on at least one side surface of the laminated structure 11. In FIGS. 1 and 2, the reflective tape 50 covers the counter surface 10s3 facing the light incidence surface 10s1. The reflective tape 50 may cover a side surface 10s of the light guide plate 10, a side surface 20s of the low refractive layer 20, a side surface 30s of the wavelength conversion layer 30, and a side surface 40s of the passivation layer 40. As seen in FIG. 2, since the passivation layer 40 covers the side surface 20s of the low refractive layer 20 and the side surface 30s of the wavelength conversion layer 30, the reflective tape 50 contacts the side surface 10s of the light guide plate 10 and the side surface 40s of the passivation layer 40. However, in some exemplary embodiments, the side surface to which the reflective tape 50 is attached may be a cut side surface described above in FIGS. 5 through 8. In this case, the side surface 10s of the light guide plate 10, the side surface 20s of the low refractive layer 20, the side surface 30s of the wavelength conversion layer 30, and the side surface 40s of the passivation layer 40 may be exposed to the outside, and the reflective tape 50 may contact each of the side surface 10s of the light guide plate 10, the side surface 20s of the low refractive layer 20, the side surface 30s of the wavelength conversion layer 30, and the side surface 30s of the passivation layer 40.

The reflective tape 50 may include a first folded portion 50a, a second folded portion 50b, and a side portion 50s. The side portion 50s is a portion facing a side surface of the laminated structure 11. In other words, the side portion 50s is an inner side surface and may oppose an outer side surface of the reflective tape 50 with respect to a structure of the laminated structure 11. The first folded portion 50a is a portion extending from the side portion 50s toward one side of the reflective tape 50 and is folded along a first folding line FL1 to cover the upper surface of the laminated structure 11. The second folded portion 50b is a portion extending from the side portion 50s toward the other side of the reflective tape 50 and is folded along a second folding line FL2 to cover the lower surface of the laminated structure 11.

The first folded portion 50a and the second folded portion 50b of the reflective tape 50 may be regions of the reflective tape 50. The first folded portion 50a of the reflective tape 50 may partially cover the upper surface 40a of the passivation layer 40. The second folded portion 50b of the reflective tape 50 may partially cover the lower surface 10b of the light guide plate 10. The first folded portion 50a and the second folded portion 50b of the reflective tape 50 may be connected to (or extend from) ends of the side portion 50s, respectively. The first folded portion 50a and the second folded portion 50b of the reflective tape 50 may be defined by the folding lines FL1 and FL2. The first folding line FL1 and the second folding line FL2 will be collectively referred to as folding lines FL when there is no particular distinction to be made between them. In FIGS. 1 and 2, the reflective tape 50 includes both the first folded portion 50a and the second folded portion 50b. However, reflective tapes 50_6 through 50_8 without the first folded portion 50a and/or the second folded portion 50b will be described in more detail later with reference to FIGS. 18 through 23.

The reflective tape 50 may be disposed on a side surface of the laminated structure 11 to prevent light incident into the laminated structure 11 from leaking to the outside. For instance, referring to FIG. 1, light emitted from the light source 400 is incident into the light guide plate 10 through the light incidence surface 10s1 of the light guide plate 10. The light incident into the light guide plate 10 may be guided toward the wavelength conversion layer 30 by the light guide plate 10. However, some of the light may leak out of the laminated structure 11 instead of traveling toward the wavelength conversion layer 30. For example, the incident light may leak through the counter surface 10s3 of the light guide plate 10. The reflective tape 50 may include a reflective surface to reflect incident light. Therefore, the reflective tape 50 may be attached to the side surface (e.g., the counter surface 10s3) of the laminated structure 11 so as prevent the leakage of at least some of the light incident into the light guide plate 10.

The first folded portion 50a and the second folded portion 50b of the reflective tape 50 may effectively block light leaking through an upper side and a lower side of the counter surface 10s3 of the light guide plate 10. In addition, the first folded portion 50a and the second folded portion 50b of the reflective tape 50 may improve the adhesion of the reflective tape 50 to the side surface of the laminated structure 11. If the adhesion surface between the laminated structure 11 and the reflective tape 50 has a lifted region, the lifted region may serve as a path through which incident light leaks. Therefore, the reflective tape 50 may be attached to the laminated structure 11 without a lifted region through the first folded portion 50a and the second folded portion 50b.

If the area of the first folded portion 50a is too large, the adhesive strength of the reflective tape 50 may be improved, but a dead space may also be widened. Therefore, the area of the first folded portion 50a may be adjusted according to predetermined viewing angle characteristics. That is, the area of the first folded portion 50a and the area of the second folded portion 50b may be different from each other in some exemplary embodiments. A reflective tape 50_6 that does not include the first folded portion 50a to eliminate a dead space formed by the first folded portion 50a will be described in more detail later with reference to FIGS. 18 and 19.

The side portion 50s of the reflective tape 50 may include a reflective pattern or a fluorescent pattern on the reflective surface. The reflective surface and the reflective pattern of the reflective tape 50 will now be described using plan views of reflective tapes in FIGS. 9 through 11.

Figure 9:
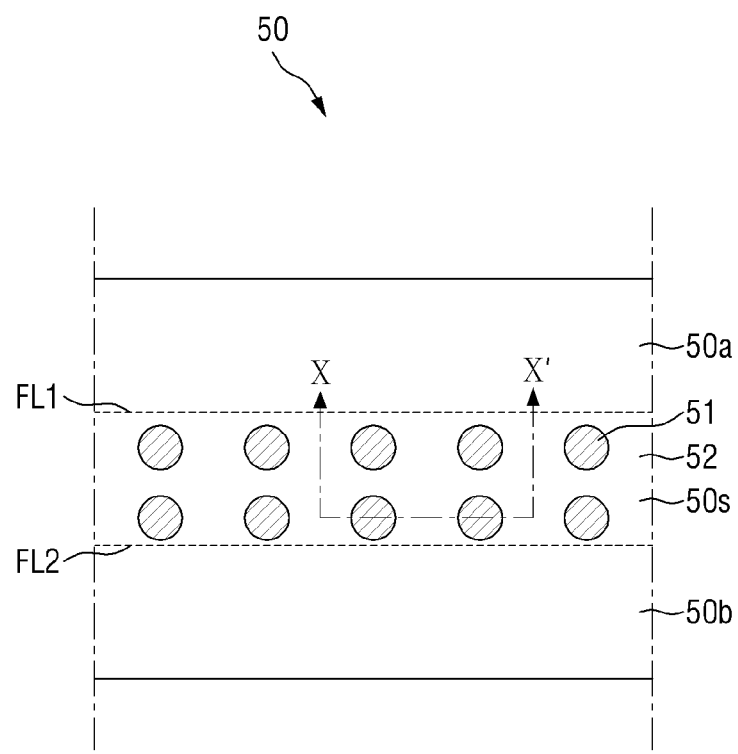
FIG. 9 is a plan view of a reflective tape according to some exemplary embodiments.
Figure 10:
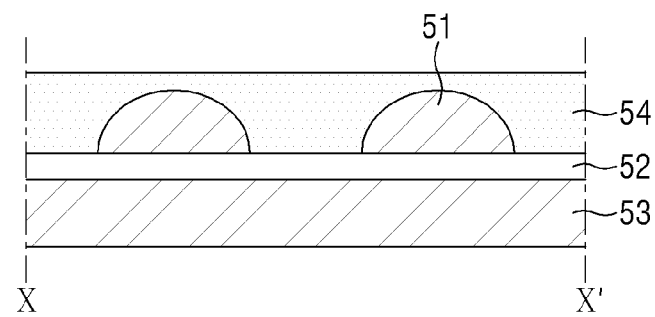
FIG. 10 is a cross-sectional view taken along sectional line X-X' of FIG. 9 according to some exemplary embodiments.
Figure 11:
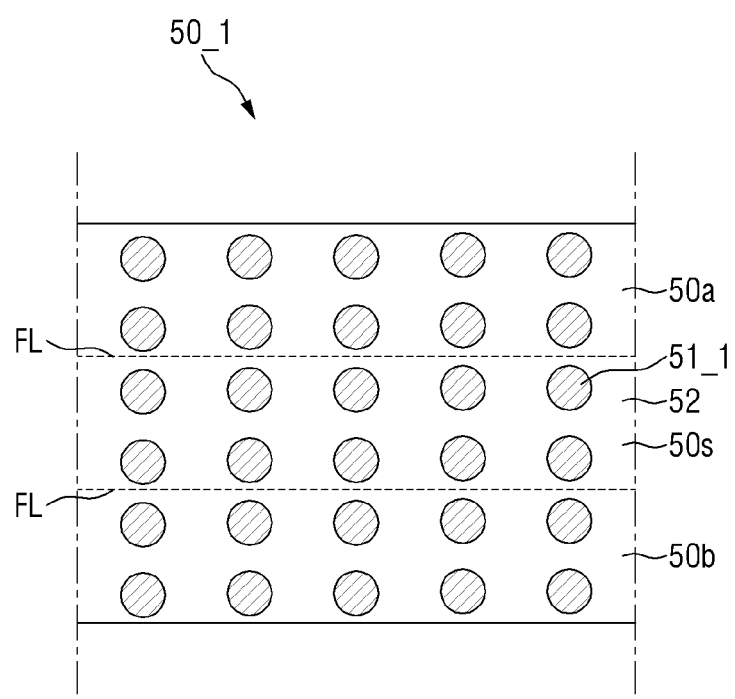
FIG. 11 is a plan view of a reflective tape according to some exemplary embodiments.

FIG. 9 is a plan view of a reflective tape 50 according to some exemplary embodiments. FIG. 10 is a cross-sectional view taken along sectional line X-X' of FIG. 9 according to some exemplary embodiments. FIG. 11 is a plan view of a reflective tape 50_1 according to some exemplary embodiments.

Referring to FIGS. 9 and 10, the reflective tape 50 may include a first folded portion 50a, a second folded portion 50b, and a side portion 50s as described above. The first folded portion 50a and the second folded portion 50b may be connected to the side portion 50s, and each region may be defined by folding lines FL. The areas (e.g., surface areas) of the first folded portion 50a and the second folded portion 50b may be the same. In addition, the areas of the first folded portion 50a and the second folded portion 50b may be smaller than the area (e.g., surface area) of the side portion 50s. However, the areas of the first folded portion 50a, the second folded portion 50b, and the side portion 50s are not limited to this case, and, in some exemplary embodiments, the area of the first folded portion 50a may be larger than the area of the second folded portion 50b, or vice versa.

The reflective tape 50 may include a base layer 53, a reflective layer 52, a pattern layer 51, and an adhesive layer 54. For descriptive and illustrative convenience, the adhesive layer 54 is not shown in FIG. 9. The base layer 53 may be a support member for supporting each layer of the reflective tape 50. The size of the base layer 53 may be substantially the same as the size of the reflective tape 50. The base layer 53 may be in the form of a thin film whose upper and lower surfaces are parallel to each other. The material of the base layer 53 is not limited as long as it is flexible and can block the penetration of moisture/oxygen.

Figure 25:
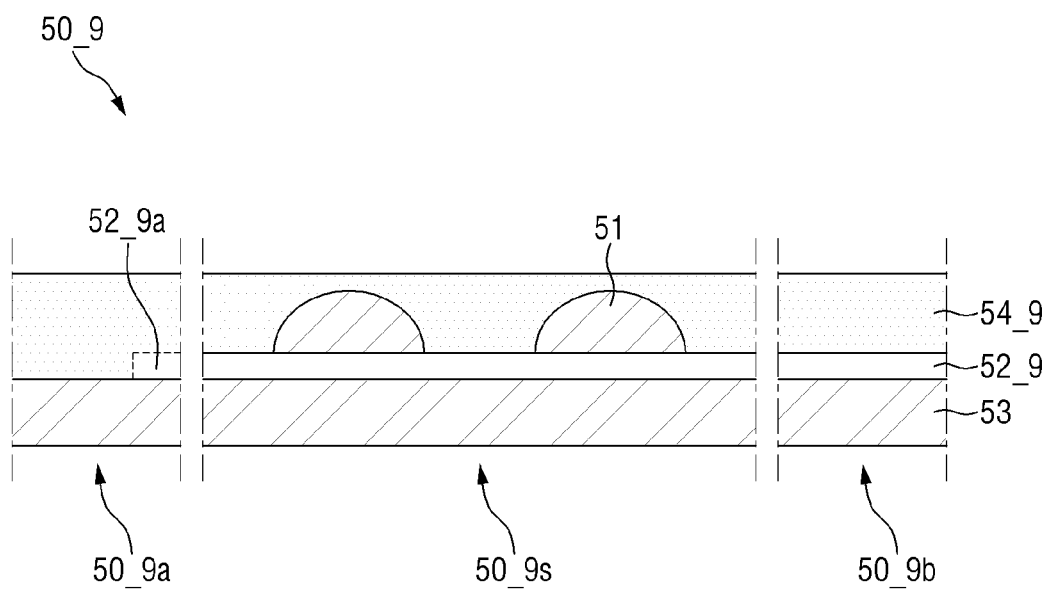
FIG. 25 is a cross-sectional view of a reflective tape according to some exemplary embodiments.

The reflective layer 52 may be disposed on the base layer 53. The reflective layer 52 may be formed to cover the entire surface of the base layer 53; however, exemplary embodiments are not limited thereto. For instance, as seen in FIG. 9, the reflective layer 52 may be formed on the entire surface of the reflective tape 50 including the first folded portion 50a, the second folded portion 50b, and the side portion 50s. In some exemplary embodiments, such as seen in FIG. 25, the reflective layer 52_9 may be formed on a limited portion of the reflective tape 50_9, such as on the second folded portion 50_9b and the side portion 50_9s. In other words, the reflective layer 50_9 may not be disposed in the first folded region 50_9a and the adhesive layer 54_9 may fill a space in which the reflective layer 52_9 is not disposed. It is contemplated, however, that a portion 52_9a of the reflective layer 52_9 may extend into at least a portion of the first folding region 50_9a, and, as such, may improve a light blocking effect, e.g., may reduce light leakage. Accordingly, the adhesive benefits of including the first folding portion 50_9a (or a larger size of the first folding portion 50_9a) may be achieved without increasing (or minimally increasing) a size of dead space that would otherwise be formed. In other words, the adhesive strength of the reflective tape 50_9 may be improved, but a dead space may not be widened or may be slightly widened in those instances including portion 52_9a of the reflective layer 52_9. Other than the aforementioned differences, the structure of the reflective tape 50_9 of FIG. 25 may be similar to the structure of the reflective tape 50 of FIGS. 9 and 10.

Adverting back to FIGS. 9 and 10, the reflective layer 52 may be formed such that an upper surface of the reflective layer 52 is parallel to an upper surface of the base layer 53. To this end, the reflective layer 52 may have a property of reflecting all light incident on (or to) the reflective tape 50. The reflective layer 52 may reflect light of all wavelength bands irrespective of the wavelength band of the light. The material of the reflective layer 52 is not limited as long as it can reflect light of all wavelength bands. For example, the reflective layer 52 may include a light reflecting material having high reflectance, such as a metal. In some exemplary embodiments, the reflective layer 52 may include Ag. In some exemplary embodiments, the reflective layer 52, like a reflective polarizing film, may have a structure in which a plurality of layers having different refractive indices are laminated. The reflective layer may be directly deposited or coated on the upper surface of the base layer 53. In some exemplary embodiments, a separate member including the reflective layer 52 may be attached.

The pattern layer 51 may be disposed on the reflective layer 52. In FIG. 9, the pattern layer 51 is formed in the side portion 50s of the reflective tape 50. The side portion 50s may be divided into a region where the pattern layer 51 is formed and a reflective layer region that does not overlap the pattern layer 51. The region where the pattern layer 51 is formed may be a region that emits yellow light, and the reflective layer region that does not overlap the pattern layer 51 may be a region that reflects light of all wavelength bands. As described above, incident light may be blue light. The blue light reflected by the reflective layer 52 that does not overlap the pattern layer 51 may be mixed with the yellow light emitted from the pattern layer 51 to form white light. In a plan view, the reflective tape 50 may include a surface that overlaps the pattern layer 51 and a surface that does not overlap the pattern layer 51. That is, the surface of the reflective tape 50 that overlaps the pattern layer 51 may emit yellow light. The reflective tape 50 may prevent the blue light from being visible to a user at an edge of a display by converting the blue light into white light using the pattern layer 51.

In the side portion 50s, the pattern layer region and the reflective layer region that does not overlap the pattern layer 51 may have different areas. As described above, the pattern layer region may be a region that emits yellow light, and the reflective layer region that does not overlap the pattern layer 51 may be a region that emits blue light, e.g., incident light. That is, the magnitude of the yellow light emitted from the reflective tape 50 may increase as the area of the pattern layer region increases, and the magnitude of the blue light reflected by the reflective tape 50 may increase as the area of the reflective layer region that does not overlap the pattern layer 51 increases. A ratio of the area of a pattern layer 51 to the area of a surface on which the pattern layer 51 is disposed (e.g., the area of the side portion 50s) may be defined as the density of the patterned layer 51. For example, in FIG. 9, the density of the pattern layer 51 may be the ratio of the area of the pattern layer 51 to the area of the side portion 50s in which the pattern layer 51 is disposed. In some exemplary embodiments, the density of the pattern layer 51 may be 30% to 70%, e.g., 40% to 60%, such as 30% to 50%, for instance, 50% to 70%. However, the area of the pattern layer 51 may vary according to the material of the pattern layer 51.

The pattern layer 51 may be a yellow pattern in some exemplary embodiments. The yellow pattern may reflect yellow light and absorb other light. When external light including all wavelength bands is incident from the outside, the pattern layer 51 including the yellow pattern may reflect yellow light and absorb other light. That is, the reflective tape 50 may emit white light by mixing the yellow light reflected from the yellow pattern and the incident light reflected from the reflective layer 52 that does not overlap the yellow pattern. The yellow pattern may more effectively prevent the leakage of the incident light by absorbing blue light, which is the incident light, in the side portion 50s of the reflective tape 50 that is in contact with the counter surface. e.g., side surface 10s3. The material of the yellow pattern is not limited as long as it can reflect yellow light and absorb other light. In some exemplary embodiments, the yellow pattern may be a yellow photoresist or a yellow color filter. For example, the yellow pattern may transmit yellow light and absorb other light, and the transmitted yellow light may be reflected at an interface between the pattern layer 51 and the reflective layer 52.

The pattern layer 51 may be a yellow reflective pattern in some exemplary embodiments. The yellow reflective pattern may include a material having higher reflectance than that of the yellow pattern described above. For example, the yellow reflective pattern may be formed by providing a material having high reflectance on an upper or lower surface of the yellow pattern or inside the yellow pattern.

The pattern layer 51 may be a yellow fluorescent pattern in some exemplary embodiments. The yellow fluorescent pattern may absorb light of a predetermined wavelength band from among incident light, convert the absorbed light into yellow light, and emit the yellow light to the outside. In some exemplary embodiments, the yellow fluorescent pattern may absorb light of a blue wavelength band and emit light of a yellow wavelength band including light of a red wavelength band and light of a green wavelength band. When light incident on the light guide plate 10 (see FIG. 1) travels toward the counter surface 10s3 (see FIG. 1) and reaches the side portion 50s of the reflective tape 50, the yellow fluorescent pattern in the side portion 50s may absorb blue light that is the incident light, convert the blue light into yellow light, and emit the yellow light. The reflective layer 52 that does not overlap the pattern layer 51 of the side portion 50s may reflect the blue light that is the incident light. That is, the reflective tape 50 may emit white light by mixing the yellow light emitted from the pattern layer 51 and the blue light reflected from the reflective layer 52. The yellow fluorescent pattern may include, but is not limited to, a yellow phosphor.

In some exemplary embodiments, the yellow fluorescent pattern itself may be yellow so as to not only convert light using a fluorescent material, but also reflect yellow light and absorb other light, like the yellow pattern described above.

When the yellow fluorescent pattern is included as the pattern layer 51, the area of the pattern layer 51 may be smaller than when the yellow pattern and the yellow reflective pattern described above are included. That is, the yellow fluorescent pattern may have higher yellow light emission efficiency than other patterns. For the same area, yellow light emitted from the yellow pattern, yellow light emitted from the yellow reflective pattern, and yellow light emitted from the yellow fluorescent pattern may have different magnitudes, and the magnitude of the yellow light emitted from the yellow fluorescent pattern may be larger. Therefore, even if the area of the yellow fluorescent pattern in the reflective tape 50 is smaller than those of the yellow pattern and the yellow reflective pattern, use of the yellow fluorescent pattern can sufficiently form white light. However, the area of the pattern layer 51 is not limited to the above case(s) and can be adjusted according to the material of the pattern layer 51 and the density of the material with respect to side portion 50s of the reflective tape 50s.

The pattern layer 51 described above may have various shapes. Referring to FIG. 9, the pattern layer 51 may be composed of a plurality of circular patterns arranged in two rows. However, the pattern layer 51 is not limited to this shape and may also have polygonal patterns or irregular patterns. Additionally or alternatively, the pattern layer 51 may be composed of two or more rows.

The pattern layer 51 may be formed only on a surface of the reflective tape 50. In some exemplary embodiments, the pattern layer 51 may be formed only in the side portion 50s of the reflective tape 50, as illustrated in FIG. 9. Referring to FIGS. 1 and 2, light incident into the light guide plate 10 travels mainly toward the counter surface 10s3 of the light guide plate 10, and more light may travel toward the side portion 50s than toward the first folded portion 50a and the second folded portion 50b of the reflective tape 50. Therefore, a sufficient light leakage blocking effect can be obtained even if the pattern layer 51 is formed only in the side portion 50s such as described in association with FIG. 9. However, referring to FIG. 11, a pattern layer 51_1 may be formed on the entire surface of the reflective tape 50_1 in some exemplary embodiments. When the pattern layer 51_1 is also formed on a first folded portion 50a and a second folded portion 50b of the reflective tape 50_1, it may be formed at a same time in the manufacturing process. Thus, the manufacturing process can be simplified. In addition, of the incident light, light traveling toward the first folded portion 50a and the second folded portion 50b may also be converted into white light, thereby effectively preventing light leakage. Other than the aforementioned difference, the structure of the reflective tape 50_1 of FIG. 11 may be similar to the structure of the reflective tape 50 of FIGS. 9 and 10.

Hereinafter, optical members according to various exemplary embodiments will be described. In the following exemplary embodiments, elements identical to those of the above-described exemplary embodiment(s) will be indicated by the same reference numerals, and a description of such elements will be omitted or given briefly. The following exemplary embodiments will be described focusing mainly on differences from the above-described exemplary embodiments.

Figure 12:
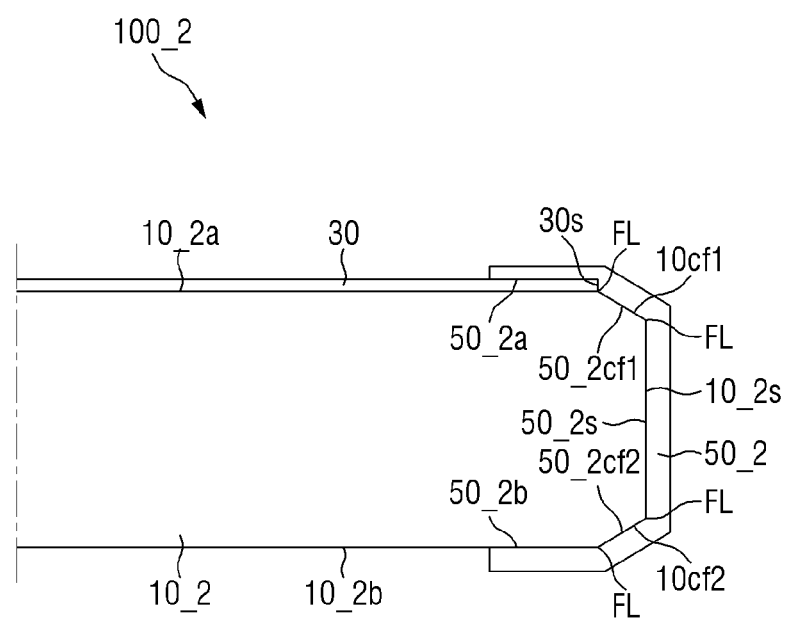
FIG. 12 is a cross-sectional view of an optical member according to some exemplary embodiments.
Figure 13:
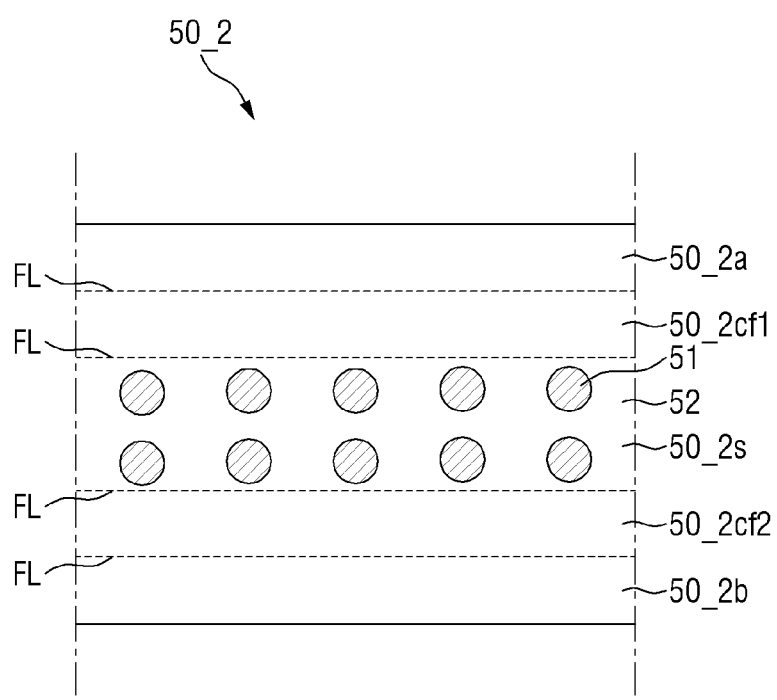
FIG. 13 is a plan view of a reflective tape of FIG. 12 according to some exemplary embodiments.

FIG. 12 is a cross-sectional view of an optical member 100_2 according to some exemplary embodiments. FIG. 13 is a plan view of a reflective tape 50_2 of FIG. 12 according to some exemplary embodiments. The exemplary embodiment(s) of FIGS. 12 and 13 is different from the exemplary embodiment(s) of FIG. 9 in that a light guide plate 10_2 further includes corner surfaces (e.g., inclined corners or inclined corner surfaces) and the reflective tape 50_2 further includes corresponding corner attachment surfaces.

For instance, as seen in FIG. 12, the optical member 100_2 includes a wavelength conversion layer 30, and a low refractive layer 20 (see FIG. 2) and a passivation layer 40 (see FIG. 2) are not illustrated for ease of description and illustration. However, the optical member 100_2 may further include the low refractive layer 20 and the passivation layer 40. In addition, the wavelength conversion layer 30 is thinner than the light guide plate 10_2 in FIG. 12. However, the thickness of the wavelength conversion layer 30 is not limited to that illustrated in FIG. 12, and the actual thickness of the wavelength conversion layer 30 may be greater or smaller than that illustrated in FIG. 12.

Referring to FIGS. 12 and 13, the optical member 100_2 may include the light guide plate 10_2, the wavelength conversion layer 30 disposed on an upper surface 10_2a of the light guide plate 10_2, and the reflective tape 50_2 covering a side surface 10_2s of the light guide plate 10_2 and a side surface 30s of the wavelength conversion layer 30.

The light guide plate 10_2 may further include corners (e.g., inclined corners or corner surfaces) 10cf1 and 10cf2 between the upper surface 10_2a and the side surface 10_2s of the light guide plate 10_2 and/or between a lower surface 10_2b and the side surface 10_2s of the light guide plate 10_2. The upper surface 10_2a and the lower surface 10_2b of the light guide plate 10_2 meet respective sides of the corners 10cf1 and 10cf2, and the side surface 10_2s of the light guide plate 10_2 meets the other respective sides of the corners 10cf1 and 10cf2. The corners 10cf1 and 10cf2 are inclined with respect to the upper surface 10_2a, the lower surface 10_2b, and the side surface 10_2s of the light guide plate 10_2. The corners 10cf1 and 10cf2 may lessen the sharpness of the corners of the light guide plate 10_2 to prevent breakage due to an external impact. Further, the corners 10cf1 and 10cf2 may enable effective total internal reflection inside the light guide plate 10_2 and prevent light leakage.

The corners 10cf1 and 10cf2 may be flat as illustrated in FIG. 12. However, in some exemplary embodiments, the corners 10cf1 and 10cf2 may be curved.

The corners 10cf1 and 10cf2 may be divided into an upper corner 10cf1 located above the side surface 10_2s of the light guide plate 10_2 and a lower corner 10cf2 located below the side surface 10_2s of the light guide plate 10_2. In FIG. 12, the light guide plate 10_2 includes both the upper corner 10cf1 and the lower corner 10cf2. However, in some exemplary embodiments, the light guide plate 10_2 may include any one of the upper corner 10cf1 and the lower corner 10cf2. In addition, the upper corner 10cf1 or the lower corner 10cf2 may be a surface including a plurality of planes or surfaces.

The reflective tape 50_2 may be attached to the light guide plate 10_2 including the corners 10cf1 and 10cf2 without a lifted region from the light guide plate 10_2. For instance, referring to FIG. 13, the reflective tape 50_2 may include an upper corner attachment surface 50_2cf1 corresponding to the upper corner 10cf1 of the light guide plate 10_2 and disposed between a side portion 50_2s and a first folded portion 50_2a of the reflective tape 50_2. In addition, the reflective tape 50_2 may include a lower corner attachment surface 50_2cf2 corresponding to the lower corner 10cf2 of the light guide plate 10_2 and disposed between the side portion 50_2s and a second folded portion 50_2b of the reflective tape 50_2. A line at which ends of the surfaces of the reflective tape 50_2 meet may be a folding line FL. When the corners 10cf1 and 10cf2 are flat, the reflective tape 50_2 may include a total of four folding lines FL. The reflective tape 50_2 may be attached along the side surface 10_2s of the light guide plate 10_2 and the surfaces of the corners 10cf1 and 10cf2 and may be attached without a lifted region from the light guide plate 10_2 through the folding lines FL. If the reflective tape 50_2 does not include the corner attachment surfaces 50_2cf1 and 50_2cf2, a lifted tolerance region may be formed between the corners 10cf1 and 10cf2 and the reflective tape 50_2. The tolerance region formed between the light guide plate 10_2 and the reflective tape 50_2 may serve as a path through which incident light leaks, as described above.

Figure 14:
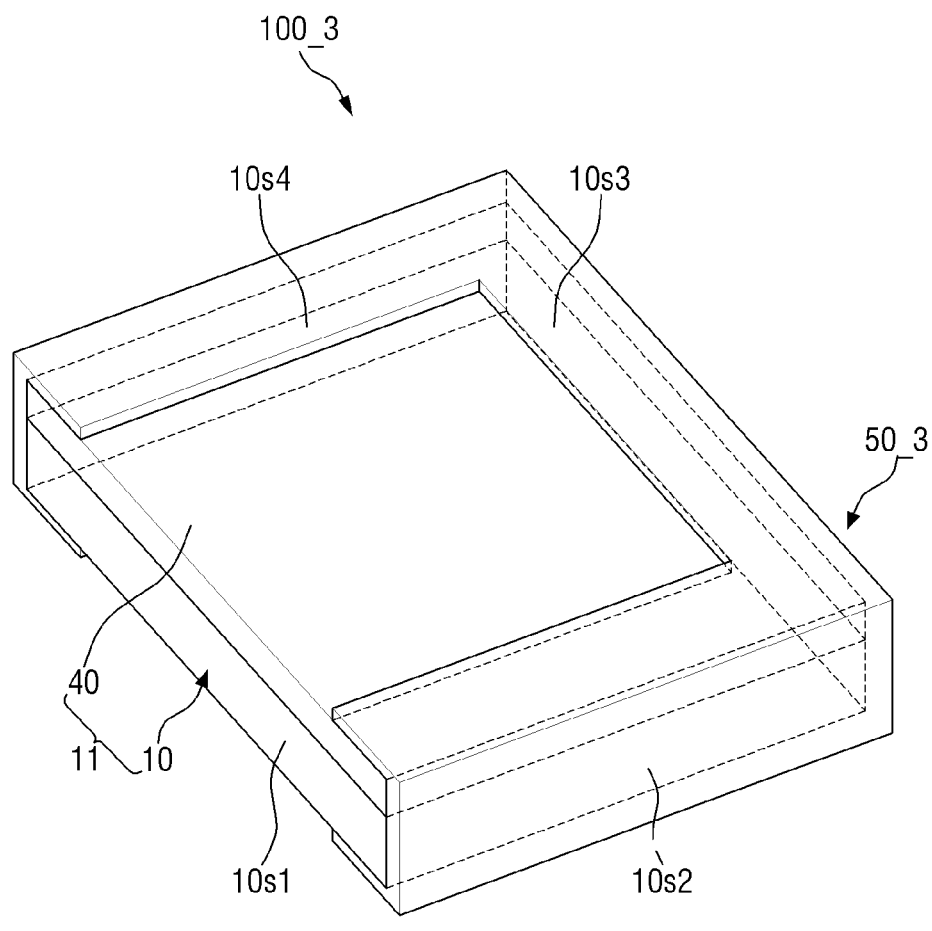
FIG. 14 is a perspective view of an optical member according to some exemplary embodiments.
Figure 15:
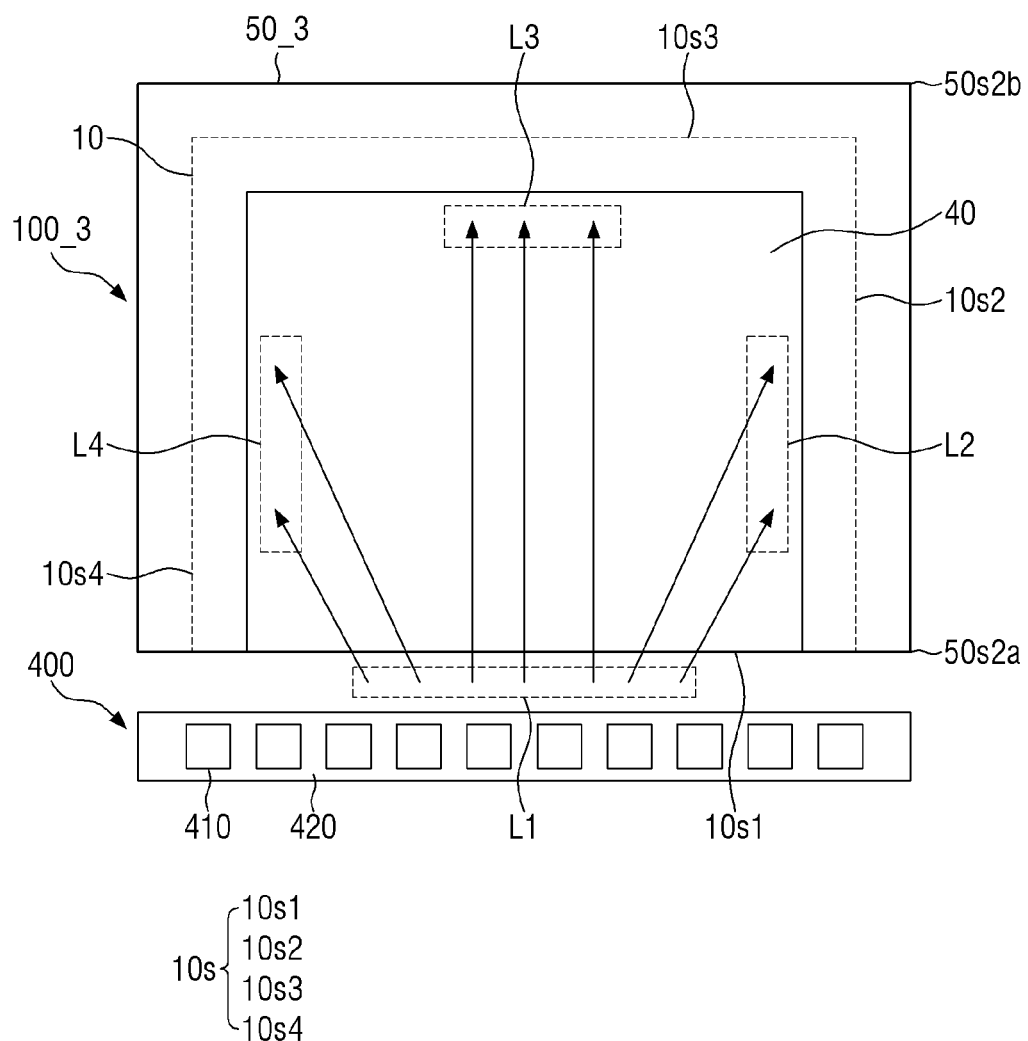
FIG. 15 is a plan view of the optical member of FIG. 14 and a light source according to some exemplary embodiments.

FIG. 14 is a perspective view of an optical member 100_3 according to some exemplary embodiments. FIG. 15 is a plan view of the optical member 100_3 of FIG. 14 and a light source 400 according to some exemplary embodiments. FIGS. 14 and 15 show that a reflective tape 50_3 can cover a plurality of side surfaces 10s of a light guide plate 10.

For instance, referring to FIGS. 14 and 15, the optical member 100_3 includes a laminated structure 11 and a reflective tape 50_3 covering side surfaces of the laminated structure 11. The reflective tape 50_3 may cover a counter surface 10s3 of the light guide plate 10 and may further cover side surfaces 10s2 and 10s4 connected to the counter surface 10s3, s1 That is, the reflective tape 50_3 may be formed to cover each of the side surfaces 10s2, 10s3, and 10s4, except for a light incidence surface 10s1. Light incident through the light incidence surface 10s1 may leak not only through the counter surface 10s3, but also through the side surfaces 10s2 and 10s4 connected to the counter surface 10s3. Therefore, the leakage of the incident light may be prevented by the reflective tape 50_3 further covering the right side surface 10s2 and the left side surface 10s4 of the light guide plate 10. In FIG. 14, the light guide plate 10 including three side surfaces 10s2, 10s3, and 10s4, except for the light incidence surface 10s1 is illustrated; however, exemplary embodiments are not limited to this case. For instance, in some exemplary embodiments, a reflective tape may cover at least two side surfaces from among a plurality of side surfaces of a polygonal light guide plate having three or more side surfaces, except for a light incident surface.

The amount of light reaching each side surface 10s2, 10s3, or 10s4 of the light guide plate 10 after being incident through the light incidence surface 10s1 will now be described with reference to FIG. 15.

Referring to FIG. 15, light L1 emitted from the light source 400 and then incident on the light guide plate 10 may be divided into light L2 travelling toward the right side surface 10s2 of the light guide plate 10, light L3 travelling toward the counter surface 10s3, and light LA travelling toward the left side surface 10s4. Here, of the light L2, L3, and LA traveling toward the side surfaces 10s2, 10s3, and 10s4, the light L3 traveling toward the counter surface 10s3 may have the largest magnitude.

In addition, the light L2 and the light L4 traveling toward the right side surface 10s2 and the left side surface 10s4 may have substantially the same magnitude. The magnitude of incident light reaching the right side surface 10s2 and the left side surface 10s4 may be reduced from the light incidence surface 10s1 toward the counter surface 10s3. That is, in the right side surface 10s2 and the left side surface 10s4, the magnitude of incident light reaching a region adjacent to the light incidence surface 10s1 may be larger than the magnitude of incident light reaching a region adjacent to the counter surface 10s3. Accordingly, the area of a pattern layer 51 (see FIG. 9) of the reflective tape 50_3 that contacts the right side surface 10s2 and the left side surface 10s4 of the light guide plate 10 may also be changed.

Figure 16:
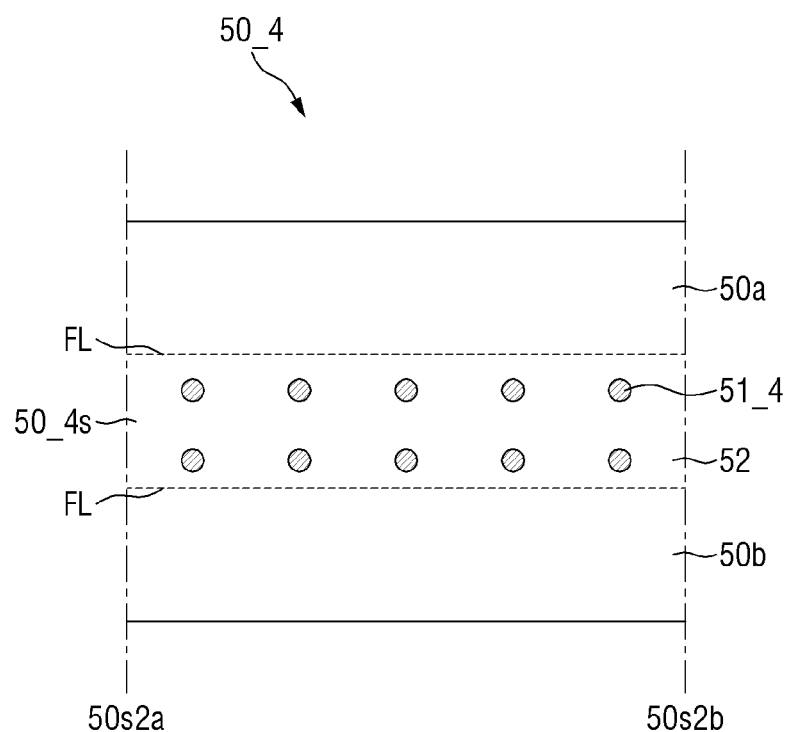
FIGS. 16 and 17 are plan views of reflective tapes according to various exemplary embodiments.
Figure 17:
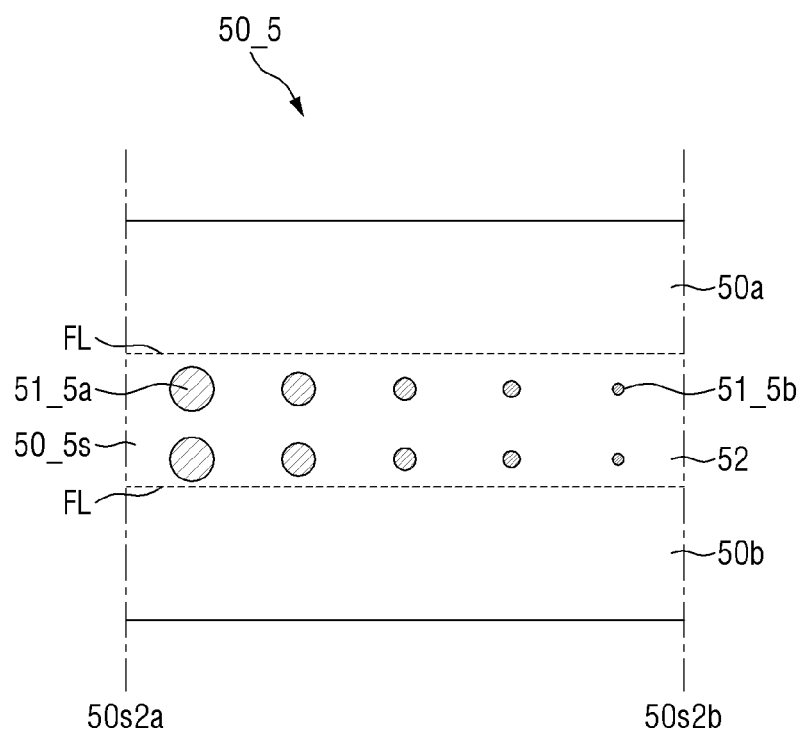

A pattern layer of a reflective tape disposed on a counter surface 10s3 and pattern layers of reflective tapes disposed on right and left side surfaces 10s2 and 10s4 will now be compared with reference to FIGS. 9, 16, and 17.

As previously described, FIG. 9 is a plan view of the reflective tape 50 according to some exemplary embodiments. In some exemplary embodiments, the reflective tape 50 may be disposed on a counter surface 10s of at least a light guide plate 10. FIGS. 16 and 17 are plan views of reflective tapes 50_4 and 50_5 according to various exemplary embodiments. In some exemplary embodiments, the reflective tapes 50_4 and 50_5 may be disposed on a right side surface 10s2 or a left side surface 10s4 of at least a light guide plate 10. In FIG. 16, the area of a pattern layer 51_4 of the reflective tape 50_4 is smaller than that of the pattern layer 51 (see FIG. 9) of the reflective tape 50 disposed on the counter surface 10s3. In FIG. 17, the area of a pattern layer 51_5a and 51_5b of the reflective tape 50_5 becomes smaller toward the counter surface 10s3.

Referring to FIGS. 15 through 17, the reflective tape 50_4 of FIG. 16 includes the pattern layer 51_4 disposed on a reflective layer 52. The density of the pattern layer 51_4 of the reflective tape 50_4 disposed on the right side surface 10s2 or left side surface 10s4 of the light guide plate 10 may be smaller than the density of the pattern layer 51 (see FIG. 9) of the reflective tape 50 (see FIG. 9) disposed on the counter surface 10s3 of the light guide plate 10. As described above, the density of a pattern layer may be defined as the ratio of the area of the pattern layer to the area of a surface on which the pattern layer is disposed. For example, in FIG. 16, the density of the pattern layer 51_4 may be the ratio of the area of the pattern layer 51_4 to the area of a side portion 50_4s in (or on) which the pattern layer 51_4 is disposed. The counter surface 10s3 of the light guide plate 10 may be a surface that a larger amount of incident light reaches, compared with the left or right side surface 10s2 and 10s4. Therefore, the density of the pattern layer 51 of the reflective tape 50 disposed on the counter surface 10s3 may be higher in order to effectively prevent leakage of incident light. In some exemplary embodiments, the density of the pattern layer 51_4 of the reflective tape 50_4 disposed on the left or right side surface 10s2 and 10s4 of the light guide plate 10 may be smaller than 30%.

In some exemplary embodiments, referring to FIG. 17, the reflective tape 50_5 may include the pattern layer 51_5a and 51_5b disposed on a reflective layer 52. The area of the pattern layer 51_5a and 51_5b disposed on, for instance, the right surface 10s2 of the light guide plate 10 may be gradually reduced from a light incidence portion 50s2a adjacent to a light incidence surface 10s1 toward a counter portion 50s2b adjacent to a counter surface 10s3. That is, since a large amount of incident light reaches the light incidence portion 50s2a adjacent to the light incidence surface 10s1, the density of the pattern layer 51_5a in the light incidence portion 50s2 may be large. On the other hand, since a small amount of incident light reaches the counter portion 50s2b adjacent to the counter surface 10s3, the density of the pattern layer 51_5b in the counter portion 50s2b may be small. Although the density of the pattern layer 51_5a and 51_5b is reduced in the propagation direction of light in FIG. 17, exemplary embodiments are not limited to this case. In some exemplary embodiments, the density of the pattern layer 51_5b may become larger toward the counter portion 50s2b, depending on the shape of the light guide plate 10 and the propagation direction of the incident light L1.

Various exemplary embodiments to be described in association with FIGS. 18 through 23 are different from the exemplary embodiment(s) of FIG. 9 in that a reflective tape does not include a first folded portion and/or a second folded portion. The various exemplary embodiments of FIGS. 18 through 23 will now be described focusing mainly on differences from the exemplary embodiment(s) of FIG. 9.

Figure 18:
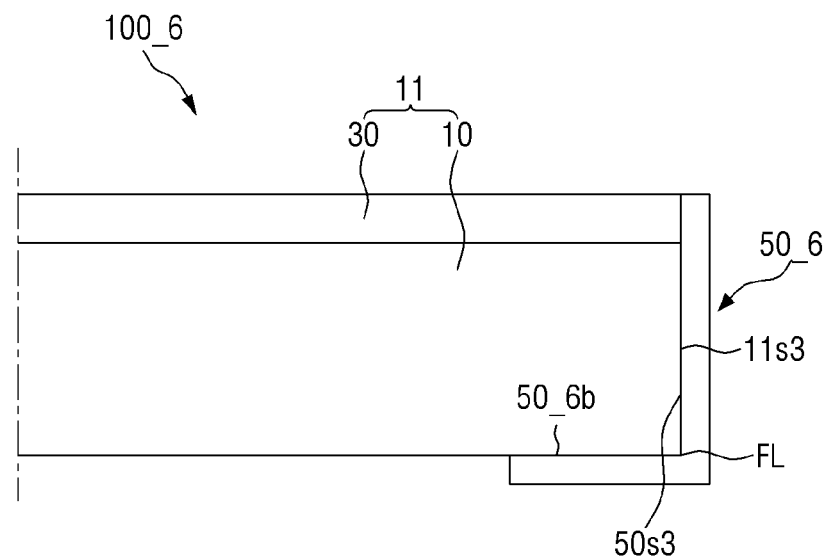
FIG. 18 is a cross-sectional view of an optical member according to some exemplary embodiments.
Figure 19:
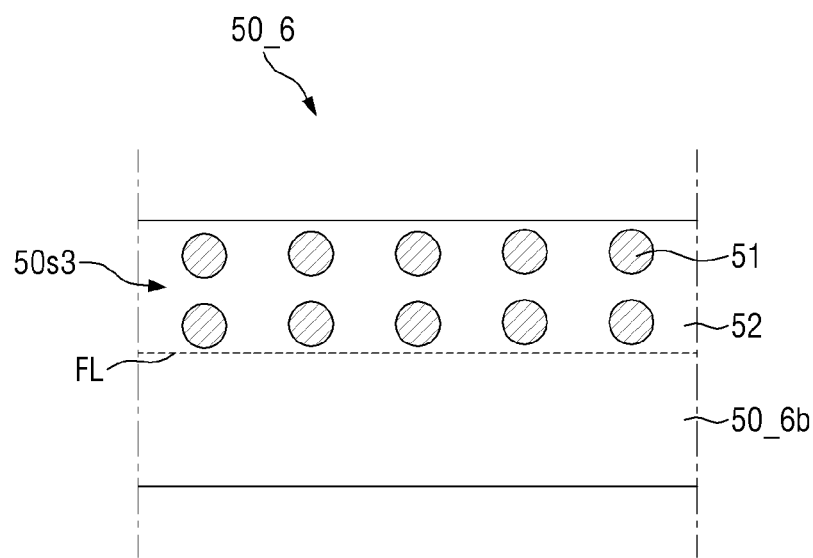
FIG. 19 is a plan view of a reflective tape of FIG. 18 according to some exemplary embodiments.

FIG. 18 is a cross-sectional view of an optical member 100_6 according to some exemplary embodiments. FIG. 19 is a plan view of a reflective tape 50_6 of FIG. 18 according to some exemplary embodiments.

Referring to FIGS. 18 and 19, the optical member 100_6 includes a light guide plate 10, a wavelength conversion layer 30 disposed on the light guide plate 10, and the reflective tape 50_6 covering side surfaces of the light guide plate 10 and the wavelength conversion layer 30. In this manner, the light guide plate 10 and the wavelength conversion layer 30 may form a laminated structure 11. Although not illustrated, in some exemplary embodiments, the optical member 100_6 may also include, as part of the laminated structure 11, a low refractive layer 20 (see FIG. 2) and a passivation layer 40 (see FIG. 2). The reflective tape 50_6 includes a side portion 50s3 facing a counter surface 11s3 of the laminated structure 11, and a second folded portion 50_6b, but may not include a first folded portion 50a (see FIG. 9). When the reflective tape 50_6 does not include the first folded portion 50a, there is no region covered by the first folded portion 50a. Therefore, incident light can be effectively emitted.

Figure 20:
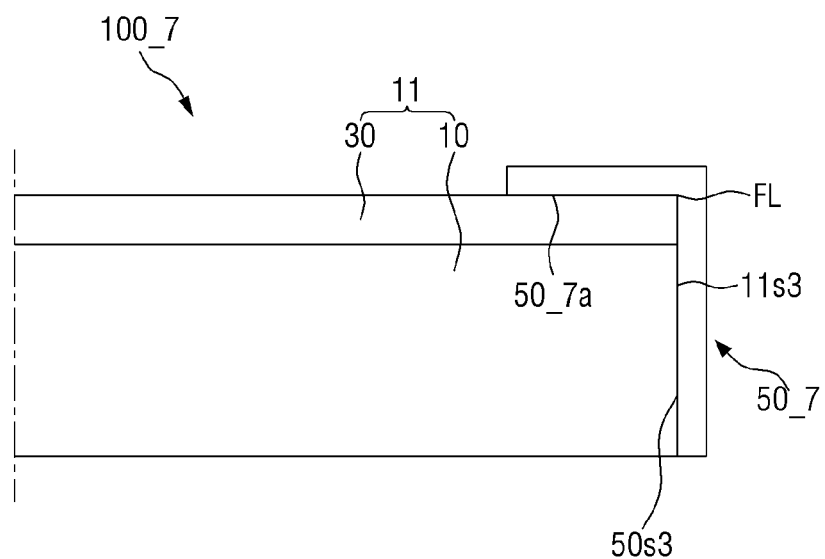
FIG. 20 is a cross-sectional view of an optical member according to some exemplary embodiments.
Figure 21:
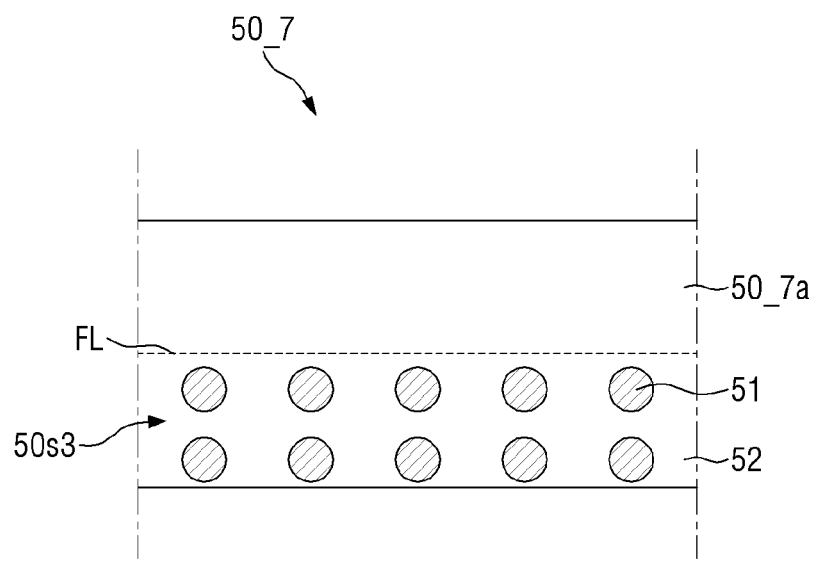
FIG. 21 is a plan view of a reflective tape of FIG. 20 according to some exemplary embodiments.

FIG. 20 is a cross-sectional view of an optical member 100_7 according to some exemplary embodiments. FIG. 21 is a plan view of a reflective tape 50_7 of FIG. 20 according to some exemplary embodiments.

Referring to FIGS. 20 and 21, the optical member 100_7 includes a light guide plate 10, a wavelength conversion layer 30 disposed on the light guide plate 10, and the reflective tape 50_7 covering side surfaces of the light guide plate 10 and the wavelength conversion layer 30. In this manner, the light guide plate 10 and the wavelength conversion layer 30 may form a laminated structure 11. Although not illustrated, in some exemplary embodiments, the optical member 100_7 may also include, as part of the laminated structure 11, a low refractive layer 20 (see FIG. 2) and a passivation layer 40 (see FIG. 2). The reflective tape 50_7 includes a side portion 50s3 facing a counter surface 11s3 of the laminated structure 11, and a first folded portion 50_7a, but may not include a second folded portion 50b (see FIG. 9). The second folded portion 50b (see FIG. 2) improves the adhesion between the reflective tape 50 (see FIG. 2) and the laminated structure 11 (see FIG. 2) and blocks light leaking through a lower surface of the laminated structure 11. However, if the adhesion between the reflective tape 50_7 and the laminated structure 11 of FIGS. 20 and 21 is sufficient, a reflective film 70 (see FIG. 24) to be described later may serve as the second folded portion 50b in the absence of the second folded portion 50b. The absence of the second folded portion 50b can reduce the thickness of the optical member 100_7 and reduce the manufacturing cost.

Figure 22:
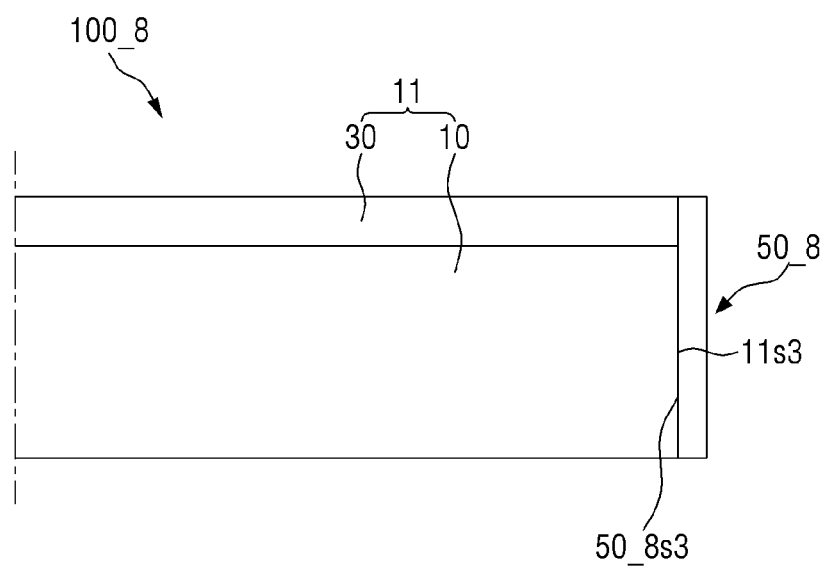
FIG. 22 is a cross-sectional view of an optical member according to some exemplary embodiments.
Figure 23:
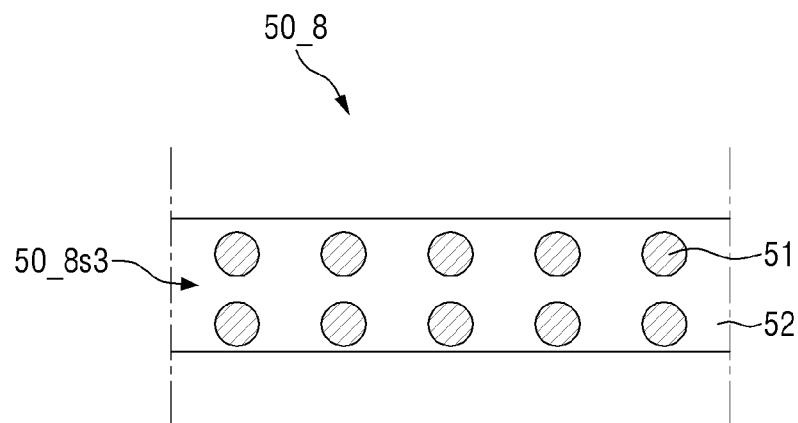
FIG. 23 is a plan view of a reflective tape of FIG. 22 according to some exemplary embodiments.

FIG. 22 is a cross-sectional view of an optical member 100_8 according to some exemplary embodiments. FIG. 23 is a plan view of a reflective tape 50_8 of FIG. 22 according to some exemplary embodiments.

Referring to FIGS. 22 and 23, the optical member 100_8 includes a light guide plate 10, a wavelength conversion layer 30 disposed on the light guide plate 10, and the reflective tape 50_8 covering side surfaces of the light guide plate 10 and the wavelength conversion layer 30. In this manner, the light guide plate 10 and the wavelength conversion layer 30 may form a laminated structure 11. Although not illustrated, in some exemplary embodiments, the optical member 100_8 may also include, as part of the laminated structure 11, a low refractive layer 20 (see FIG. 2) and a passivation layer 40 (see FIG. 2). The reflective tape 50_8 includes only a side portion 50_8s3 and may not include a first folded portion 50a (see FIG. 9) and a second folded portion 50b (see FIG. 9). When the side portion 50_8s3 of the reflective tape 50_8 is attached to a side surface 11s3 of the laminated structure 11 with sufficient adhesive strength, effects can be obtained even without the first and second folded portions 50a and 50b. When the reflective tape 50_8 does not include the first folded portion 50a and the second folded portion 50b, the thickness of the optical member 100_8 can be reduced, and the manufacturing costs can also be reduced.

Figure 24:
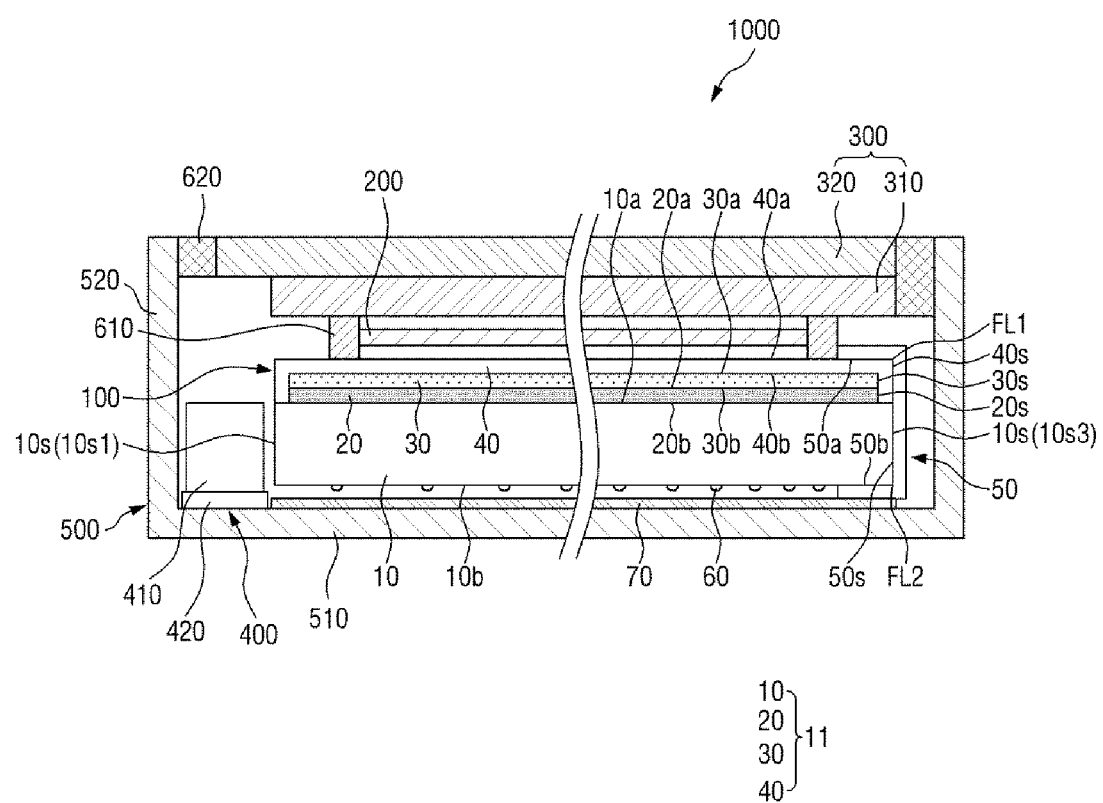
FIG. 24 is a cross-sectional view of a display device according to some exemplary embodiments.

FIG. 24 is a cross-sectional view of a display device 1000 according to some exemplary embodiments. The display device 1000 of FIG. 24 may include the optical member 100 described in association with FIGS. 1 and 2. The optical member 100 disposed inside the display device 1000 is only one example, and any of the optical members 100_1 through 100_8 may be utilized in association with the display device 1000.

Referring to FIG. 24, the display device 1000 includes a light source 400, the optical member 100 disposed on (or in) an emission path of the light source 400, and a display panel 300 disposed on (e.g., above) the optical member 100.

The light source 400 is disposed on a side of the optical member 100. The light source 400 may be disposed adjacent to a light incidence surface 10s1 of a light guide plate 10 of the optical member 100. The light source 400 may include a plurality of point light sources or linear light sources. The point light sources may be LED light sources 410. The LED light sources 410 may be mounted on a printed circuit board 420. The LED light sources 410 may emit blue light.

In some exemplary embodiments, the LED light sources 410 may be side-emitting LEDs that emit light through their side surfaces as illustrated in FIG. 24. In this case, the printed circuit board 420 may be disposed on a bottom surface 510 of a housing 500. Although not illustrated, in some exemplary embodiments, the LED light sources 410 may be top-emitting LEDs that emit light through their top surfaces. In this case, the printed circuit board 420 may be disposed on a sidewall 520 of the housing 500.

The blue light emitted from the LED light sources 410 is incident on the light guide plate 10 of the optical member 100. The light guide plate 10 of the optical member 100 guides the light and outputs the light through an upper surface 10a or a lower surface 10b. A wavelength conversion layer 30 of the optical member 100 converts part of the light of the blue wavelength incident from the light guide plate 10 into other wavelengths, such as a green wavelength and a red wavelength. The light of the green wavelength and the light of the red wavelength are emitted upward together with the unconverted light of the blue wavelength and provided toward the display panel 300.

Scattering patterns 60 may be disposed on the lower surface 10b of the light guide plate 10. The scattering patterns 60 change the angle of light propagating in the light guide plate 10 through total reflection and output the light having the changed angle to the outside of the light guide plate 10. In some exemplary embodiments, the scattering patterns 60 may be provided as a separate layer or separate patterns. For example, a pattern layer including protruding patterns and/or concave groove patterns may be formed on the lower surface 10b of the light guide plate 10, or printed patterns may be formed on the lower surface 10b of the light guide plate 10 to function as the scattering patterns 60. In some exemplary embodiments, the scattering patterns 60 may be formed of the surface shape of the light guide plate 10 itself. For example, concave grooves may be formed in the lower surface 10b of the light guide plate 10 to function as the scattering patterns 60.

The arrangement density of the scattering patterns 60 may differ depending on an area or position. For example, the arrangement density of the scattering patterns 60 may be low in an area adjacent to the light incidence surface 10s1 to which a relatively large amount of light is provided and may be high in an area adjacent to a counter surface 10s3 to which a relatively small amount of light is provided.

The display device 1000 may further include a reflective member 70 disposed under the optical member 100. The reflective member 70 may include a reflective film or a reflective coating layer. The reflective member 70 reflects light output from the lower surface 10b of the light guide plate 10 of the optical member 100 back into the light guide plate 10.

The display panel 300 is disposed above the optical member 100. The display panel 300 receives light from the optical member 100 and displays an image. Examples of such a light-receiving display panel that receives light and displays an image include a liquid crystal display panel, an electrophoretic panel, and the like. The liquid crystal display panel will, hereinafter, be described as an example of the display panel 300, but various other light-receiving display panels can be utilized in association with exemplary embodiments.

The display panel 300 may include a first substrate 310, a second substrate 320 facing the first substrate 310, and a liquid crystal layer (not illustrated) disposed between the first substrate 310 and the second substrate 320. The first substrate 310 and the second substrate 320 overlap each other. In some exemplary embodiments, any one of the first and second substrates 310 and 320 may be larger than the other substrate and may protrude further outward than the other substrate. As seem in FIG. 24, the second substrate 320 disposed on the first substrate 310 is larger and protrudes on a side where the light source 400 is disposed. The protruding area of the second substrate 320 may provide a space in which a driving chip or an external circuit board may be mounted. Unlike in the drawing, the first substrate 310 disposed under the second substrate 320 may be larger than the second substrate 320 and may protrude outward. An overlapping area of the first substrate 310 and the second substrate 320 excluding the protruding area in the display panel 300 may be substantially aligned with side surfaces 10s of the light guide plate 10 of the optical member 100.

The optical member 100 may be coupled to the display panel 300 by an inter-module coupling member 610. The inter-module coupling member 610 may be shaped like a quadrilateral frame in a plan view. The inter-module coupling member 610 may be located at edge portions of the display panel 300 and the optical member 100.

In some exemplary embodiments, a lower surface of the inter-module coupling member 610 is disposed on an upper surface 40a of a passivation layer 40 of the optical member 100. The lower surface of the inter-module coupling member 610 may be disposed on the passivation layer 40 to overlap an upper surface 30a of the wavelength conversion layer 30, but not overlap side surfaces 30s of the wavelength conversion layer 30.

The inter-module coupling member 610 may include a polymer resin or an adhesive or sticky tape.

In some exemplary embodiments, the inter-module coupling member 610 may further perform a function of a light transmission blocking pattern. For example, the inter-module coupling member 610 may include a light absorbing material, such as a black pigment or a dye, or may include a reflective material to perform the light transmission blocking function.

The display device 1000 may further include the housing 500. The housing 500 has an open surface and includes the bottom surface 510 and sidewalls 520 connected to the bottom surface 510. The light source 400, the optical member 100, and the display panel 300 are attached to each other, and the reflective member 70 may be accommodated in a space defined by the bottom surface 510 and the sidewalls 520. The light source 400, the reflective member 70, the optical member 100, and the display panel 300 attached to each other are disposed on the bottom surface 510 of the housing 500. The height of the sidewalls 520 of the housing 500 may be substantially the same as the height of the optical member 100 and the display panel 300 attached to each other inside the housing 500. The display panel 300 may be disposed adjacent to an upper end of each sidewall 520 of the housing 500 and may be coupled to the upper end of each sidewall 520 of the housing 500 by a housing coupling member 620. The housing coupling member 620 may be shaped like a quadrilateral frame in plan view. The housing coupling member 620 may include a polymer resin or an adhesive or sticky tape.

The display device 1000 may further include at least one optical film 200. One or a plurality of optical films 200 may be accommodated in a space surrounded by the inter-module coupling member 610 between the optical member 100 and the display panel 300. Side surfaces of one or a plurality of optical films 200 may be in contact with and attached to inner side surfaces of the inter-module coupling members 610. Although there is a gap between the optical film 200 and the optical member 100 and between the optical film 200 and the display panel 300 in FIG. 24, the gap is not necessarily required.

The optical film 200 (or one of the plurality of optical films 200) may be a prism film, a diffusion film, a micro-lens film, a lenticular film, a polarizing film, a reflective polarizing film, or a retardation film. The display 1000 may include a plurality of optical films 200 of the same type or different types. When a plurality of optical films 200 are applied, the optical films 200 may be placed to overlap each other, and side surfaces of the optical films 200 may be in contact with and attached to the inner side surfaces of the inter-module coupling member 610. The optical films 200 may be separated from each other, and an air layer may be disposed between the optical films 200.

According to various exemplary embodiments, an optical member can effectively prevent light incident into a light guide plate from leaking through a counter portion instead of travelling toward a wavelength conversion layer, and, when having cut surfaces, prevent penetration of moisture/oxygen and deterioration of the wavelength conversion layer by sealing side surfaces of the wavelength conversion layer. However, the effects of the various exemplary embodiments are not restricted to those described herein, and the above and other effects will become more apparent to one of ordinary skill in the art based on the description, illustrations, and the accompanying claims.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. An optical member comprising:
a light guide plate;
a wavelength conversion layer disposed on an upper surface of the light guide plate; and
a reflective tape comprising a first side portion covering first side surfaces of the light guide plate and the wavelength conversion layer,
wherein the reflective tape comprises:
a first surface configured to reflect light of a first wavelength band and light of a second wavelength band different from the first wavelength band; and
a second surface configured to absorb the light of the first wavelength band.

2. The optical member of claim 1, wherein:
the reflective tape comprises:
a base layer; and
a reflective layer disposed on the base layer; and
a surface of the reflective layer faces the first side surfaces of the light guide plate and the wavelength conversion layer.

3. The optical member of claim 2, wherein:
the reflective tape comprises a pattern layer disposed on the reflective layer;
the pattern layer partially exposes the surface of the reflective layer.

4. The optical member of claim 3, wherein:
the first surface does not overlap the pattern layer; and
the second surface of the reflective layer overlaps the pattern layer.

5. The optical member of claim 4, wherein the reflective layer is made of Ag.

6. The optical member of claim 5, wherein the pattern layer comprises a yellow phosphor.

7. The optical member of claim 3, wherein the reflective tape comprises a first folded portion extending from the first side portion toward one side of the reflective tape, the first folded portion being folded along a first folding line and covering an upper surface of the wavelength conversion layer.

8. The optical member of claim 7, wherein the reflective tape comprises a second folded portion extending from the first side portion toward another side of the reflective tape, the second folded portion being folded along a second folding line and covering a lower surface of the light guide plate.

9. The optical member of claim 8, wherein the pattern layer is not disposed in the first folded portion and the second folded portion.

10. The optical member of claim 8, wherein the pattern layer is disposed in the first folded portion and the second folded portion.

11. The optical member of claim 8, wherein the light guide plate comprises:

a first corner connected to the first side surface of the light guide plate and the upper surface of the light guide plate; and
a second corner connected to the first side surface of the light guide plate and the lower surface of the light guide plate.

12. The optical member of claim 11, wherein:
the first corner is inclined between the first side surface of the light guide plate and the upper surface of the light guide plate; and
the second corner is inclined between the first side surface of the light guide plate and the lower surface of the light guide plate.

13. The optical member of claim 11, wherein the reflective tape further comprises:
a first corner attachment surface corresponding to the first corner; and
a second corner attachment surface corresponding to the second corner.

14. The optical member of claim 13, wherein:
the first corner attachment surface is disposed between the first side portion and the first folded portion; and
the second corner attachment surface is disposed between the first side portion and the second folded portion.

15. The optical member of claim 3, wherein the reflective tape further comprises a second side portion covering second side surfaces of the light guide plate and the wavelength conversion layer.

16. The optical member of claim 15, wherein a density of the pattern layer on the reflective layer is greater in the first side portion than in the second side portion.

17. The optical member of claim 16, wherein the density of the pattern layer in the second side portion increases with increasing distance from the first side portion.

18. The optical member of claim 16, wherein the density of the pattern layer in the second side portion increases with decreasing distance from the first side portion.

19. The optical member of claim 3, wherein the pattern layer comprises a plurality of dot patterns.

20. The optical member of claim 3, wherein an area of the first surface is greater than an area of the second surface.

21. The optical member of claim 20, wherein the area of the first surface is at least twice the area of the second surface.

22. The optical member of claim 1, wherein the second surface is configured to absorb the light of the first wavelength band, convert the light of the first wavelength band into the light of the second wavelength band, and emit the light of the second wavelength band.

23. The optical member of claim 22, wherein the light of the first wavelength band is blue light.

24. The optical member of claim 23, wherein the light of the second wavelength band is yellow light.

25. The optical member of claim 24, wherein the reflective tape is configured to emit a mixture of light from the first surface and the second surface as white light.

26. An optical member comprising:
a light guide plate;
a wavelength conversion layer disposed on an upper surface of the light guide plate; and
a reflective tape comprising a plurality of side portions covering at least two side surfaces from among a plurality of side surfaces of each of the light guide plate and the wavelength conversion layer,
wherein the reflective tape comprises:
a first surface configured to reflect light of a first wavelength band and light of a second wavelength band different from the first wavelength band; and
a second surface configured to absorb the light of the first wavelength band.

27. The optical member of claim 26, wherein:
the reflective tape comprises:
a base layer;
a reflective layer disposed on the base layer; and
a pattern layer disposed on the reflective layer and partially exposing a surface of the reflective layer,
the surface of the reflective layer faces the at least two side surfaces of each of the light guide plate and the wavelength conversion layer;
the first surface does not overlap the pattern layer; and
the second surface overlaps the pattern layer.

28. The optical member of claim 27, wherein a first side portion among the plurality of side portions covers first side surfaces among the plurality of side surfaces of each of the light guide plate and the wavelength conversion layer, the first side surfaces of the light guide plate and the wavelength conversion layer facing a light incidence surface of the light guide plate.

29. The optical member of claim 28, wherein:
the light guide plate and the wavelength conversion layer respectively comprise, among the plurality of side surfaces, second side surfaces and third side surfaces adjacent to the first side surfaces;
a second side portion among the plurality of side portions covers the second side surfaces; and
a third side portion among the plurality of side portions covers the third side surfaces.

30. A display device comprising:
an optical member comprising:
a light guide plate;
a wavelength conversion layer disposed on an upper surface of the light guide plate; and
a reflective tape comprising a first side portion covering first side surfaces of the light guide plate and the wavelength conversion layer;
a light source disposed on at least one side of the light guide plate; and
a display panel disposed above the optical member,
wherein the reflective tape comprises:
a first surface configured to reflect light of a first wavelength band and light of a second wavelength band different from the first wavelength band; and
a second surface configured to absorb the light of the first wavelength band.

31. The display device of claim 30, wherein:
the reflective tape comprises:
a base layer;
a reflective layer disposed on the base layer; and
a pattern layer disposed on the reflective layer and partially exposing a surface of the reflective layer;
the surface of the reflective layer faces the first side surfaces of the light guide plate and the wavelength conversion layer;
the first surface does not overlap the pattern layer; and
the second surface overlaps the pattern layer.

32. The display device of claim 31, wherein:
the reflective layer is made of Ag; and
the pattern layer comprises a yellow phosphor.

33. The display device of claim 31, wherein:
the reflective tape comprises:
a first folded portion extending from the first side portion toward one side of the reflective tape, the first folded portion being folded along a first folding line and covering an upper surface of the wavelength conversion layer; and a second folded portion extending from the first side portion toward another side of the reflective tape, the second folded portion being folded along a second folding line and covering a lower surface of the light guide plate; and the pattern layer is not disposed in the first folded portion and the second folded portion.

34. The display device of claim 33, wherein:
the light guide plate further comprises:
- a first corner connected to the upper surface of the light guide plate and the first side surface of the light guide plate; and
- a second corner connected to the lower surface of the light guide plate and the first side surface of the light guide plate; and the reflective tape further comprises:
- a first corner attachment surface corresponding to the first corner; and
- a second corner attachment surface corresponding to the second corner.

35. The display device of claim 31, wherein:
the reflective tape further comprises:
- a second side portion covering second side surfaces of the light guide plate and the wavelength conversion layer; and
- a third side portion covering third side surfaces of the light guide plate and the wavelength conversion layer;

a density of the pattern layer on the reflective layer is greater in the first side portion than in the second side portion.

36. The display device of claim 31, wherein:
the second surface is configured to absorb the light of the first wavelength band, convert the light of the first wavelength band into light of the second wavelength band, and emit the light of the second wavelength band;
the light of the first wavelength band is blue light; and
the light of the second wavelength band is yellow light.

37. The display device of claim 31, wherein the light source is configured to emit blue light, the pattern layer is configured to emit yellow light, and the reflective tape is configured to emit a mixture of light from the first surface and the second surface as white light.

* * * * *